(12) United States Patent
Kim et al.

(10) Patent No.: US 11,545,461 B2
(45) Date of Patent: Jan. 3, 2023

(54) ADHESIVE MEMBER AND DISPLAY DEVICE INCLUDING THE SAME

(71) Applicant: Samsung Display Co., LTD., Yongin-si (KR)

(72) Inventors: Hong Am Kim, Seoul (KR); Young Min Cho, Seongnam-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 63 days.

(21) Appl. No.: 17/245,167

(22) Filed: Apr. 30, 2021

(65) Prior Publication Data

US 2021/0407957 A1 Dec. 30, 2021

(30) Foreign Application Priority Data

Jun. 29, 2020 (KR) .................. 10-2020-0078956

(51) Int. Cl.
*H01L 23/00* (2006.01)
*H01L 25/065* (2006.01)
*H01L 25/18* (2006.01)

(52) U.S. Cl.
CPC .............. *H01L 24/73* (2013.01); *H01L 24/17* (2013.01); *H01L 24/29* (2013.01); *H01L 24/32* (2013.01); *H01L 25/0657* (2013.01); *H01L 25/18* (2013.01); *H01L 2224/17515* (2013.01); *H01L 2224/29078* (2013.01); *H01L 2224/29083* (2013.01); *H01L 2224/29193* (2013.01); *H01L 2224/32059* (2013.01); *H01L 2224/32145* (2013.01); *H01L 2224/73204* (2013.01); *H01L 2225/06513* (2013.01); *H01L 2225/06555* (2013.01); *H01L 2225/06596* (2013.01)

(58) Field of Classification Search
CPC ........... H01L 2224/17515; H01L 25/18; H01L 25/0657; H01L 24/32; H01L 24/17; H01L 24/73; H01L 2224/32145; H01L 2224/73204; H01L 2225/06513
See application file for complete search history.

(56) References Cited

U.S. PATENT DOCUMENTS

| 6,031,590 A | 2/2000 | Kim | |
|---|---|---|---|
| 2019/0181389 A1* | 6/2019 | Joo | ............... H01L 51/5256 |
| 2019/0296265 A1* | 9/2019 | Um | .................. H01L 51/524 |

FOREIGN PATENT DOCUMENTS

| KR | 19980066341 A | 10/1998 |
|---|---|---|
| KR | 1020070097824 A | 10/2007 |
| KR | 1020140124333 A | 10/2014 |
| KR | 1020180070783 A | 6/2018 |

* cited by examiner

Primary Examiner — Jasmine J Clark
(74) Attorney, Agent, or Firm — Cantor Colburn LLP

(57) ABSTRACT

A display device includes a substrate including a conductive pad, a driving chip facing the substrate and including a conductive bump electrically connected to the conductive pad and an inspection bump which is insulated from the conductive pad, and an adhesive member which is between the conductive pad and the driving chip and connects the conductive pad to the driving chip. The adhesive member includes a first adhesive layer including a conductive ball; and a second adhesive layer facing the first adhesive layer, the second adhesive layer including a first area including a color-changing material, and a second area adjacent to the first area and excluding the color-changing material.

22 Claims, 18 Drawing Sheets

ADHESIVE MEMBER AND DISPLAY DEVICE INCLUDING THE SAME

This application claims priority to Korean Patent Application No. 10-2020-0078956 filed on Jun. 29, 2020, and all the benefits accruing therefrom under 35 U.S.C. § 119, the disclosure of which is incorporated herein by reference in its entirety.

BACKGROUND

1. Field

The invention relates to an adhesive member and a display device which includes the same.

2. Description of the Related Art

The importance of a display device has increased with the development of multimedia. Accordingly, various types of display devices, such as a liquid crystal display ("LCD") and an organic light emitting display ("OLED") have been used.

Such a display device includes a display area in which a plurality of pixels are arranged to display an image, and a non-display area in which driving integrated circuits (hereinafter, referred to as driving circuit chips) are arranged for driving the pixels.

The driving circuit chips arranged in the non-display area are manufactured in the form of a chip, and are mounted on a display panel of a display device by a chip on glass ("COG") method or are mounted on the display panel a tape carrier package ("TCP") method using a tape automated bonding ("TAB") technique.

SUMMARY

Embodiments of the invention provide an adhesive member which provides verification of attachment flatness of objects within a display device and a display device including the adhesive member.

However, the invention is not restricted to the embodiments set forth herein. The above and other features of the invention will become more apparent to one of ordinary skill in the art to which the invention pertains by referencing the detailed description of the invention given below.

An embodiment of a display device includes a substrate including a conductive pad, a driving chip facing the substrate and including a conductive bump electrically connected to the conductive pad and an inspection bump which is insulated from the conductive pad, and an adhesive member which is between the conductive pad and the driving chip and connects the conductive pad to the driving chip. The adhesive member includes a first adhesive layer including a conductive ball, and a second adhesive layer facing the first adhesive layer, the second adhesive layer including a first area including a color-changing material, and a second area adjacent to the first area and excluding the color-changing material.

An embodiment of a display device includes a substrate including a conductive pad, a driving chip facing the substrate and including a conductive bump electrically connected to the conductive pad and an inspection bump which is insulated from the conductive pad, and an adhesive member which is between the conductive pad and the driving chip and connects the conductive pad to the driving chip. The adhesive member includes a color-changing pattern including a color-changing material, a first adhesive layer including a first area corresponding to the color-changing pattern and a second area adjacent to the first area and corresponding to the conductive pad of the driving chip, and a second adhesive layer facing the first adhesive layer and corresponding to both the first area and the second area of the first adhesive layer.

An embodiment of an adhesive member includes a first adhesive layer which electrically connects a driving chip of a display device to a conductive pad of a substrate of the display device and a second adhesive layer facing the first adhesive layer, the second adhesive layer including a first area corresponding to an inspection bump of the driving chip which is insulated from the conductive pad of the substrate, the first area including a color-changing material, and a second area corresponding to the conductive pad of the substrate, the second area excluding the color-changing material.

BRIEF DESCRIPTION OF THE DRAWINGS

The above and other features of the invention will become more apparent by describing in detail embodiments thereof with reference to the attached drawings, in which.

DETAILED DESCRIPTION

Figure 1:
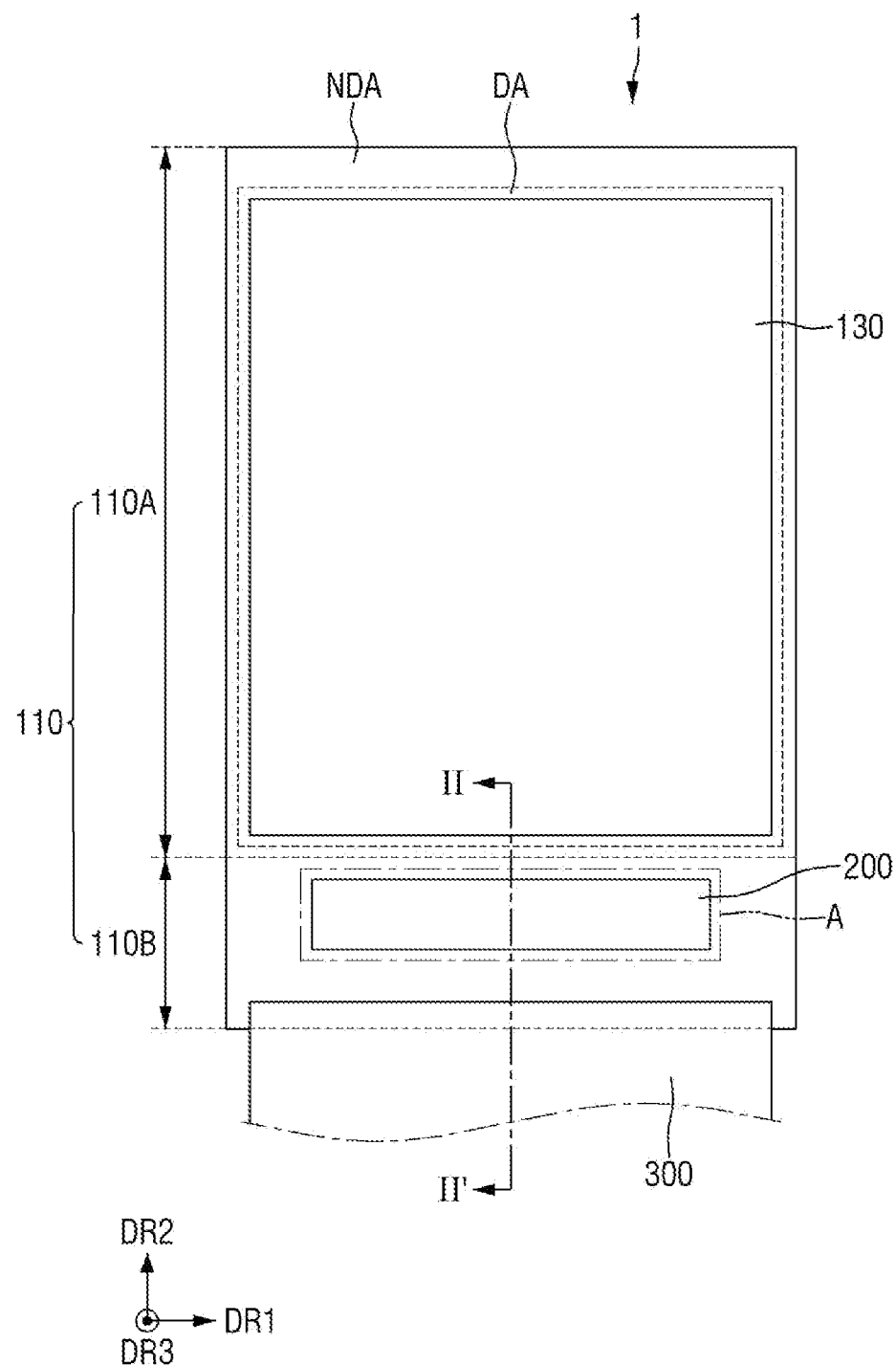
FIG. 1 is a plan view of an embodiment of a display device.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being related to another element such as being "on" another layer or substrate, it can be directly on the other layer or substrate, or intervening layers may also be present. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The same reference numbers indicate the same components throughout the specification.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the attached drawings.

A display device 1, which is an electronic device for displaying a moving image or a still image, may be used as a display screen of various electronic products such as televisions, notebooks, monitors, billboards, internet of things ("IOTs") as well as portable electronic appliances such as mobile phones, smart phones, tablet personal computers (tablet PCs), smart watches, watch phones, mobile communication terminals, electronic notebooks, electronic books, portable multimedia players ("PMPs"), navigators, and ultra-mobile PCs ("UMPCs"). Examples of the display device 1 may include an organic light emitting display device ("OLED"), a liquid crystal display device ("LCD"), a plasma display device ("PDP"), a field emission display device ("FED") and an electrophoretic display device ("EPD").

Hereinafter, an organic light emitting display device will be described as an example of the display device 1, but the invention is not limited thereto.

Figure 2:
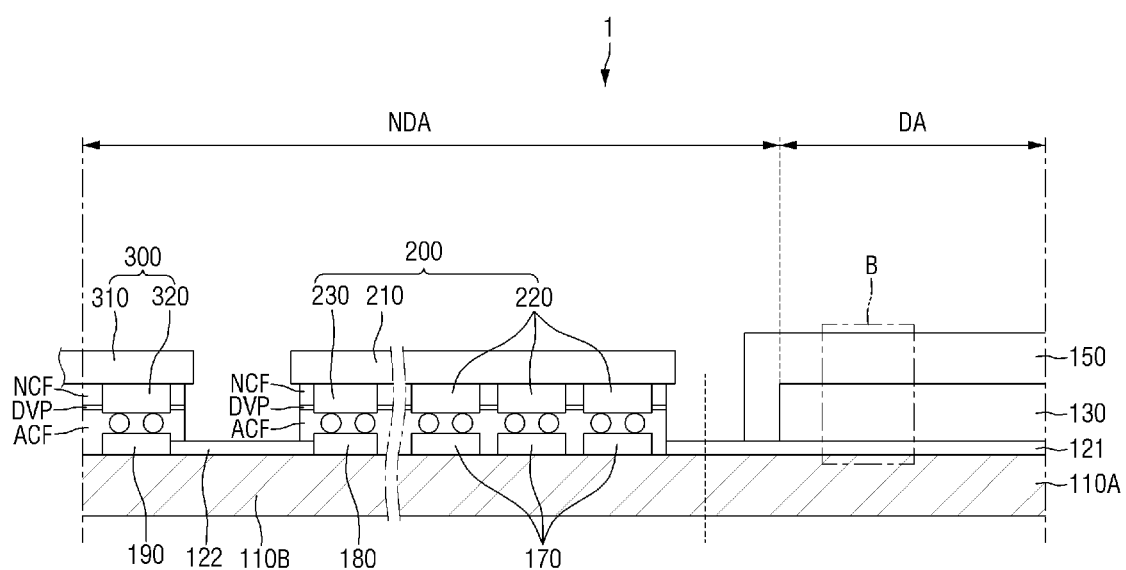
FIG. 2 is a cross-sectional view of the display device taken along line II-IP of FIG. 1.
Figure 3:
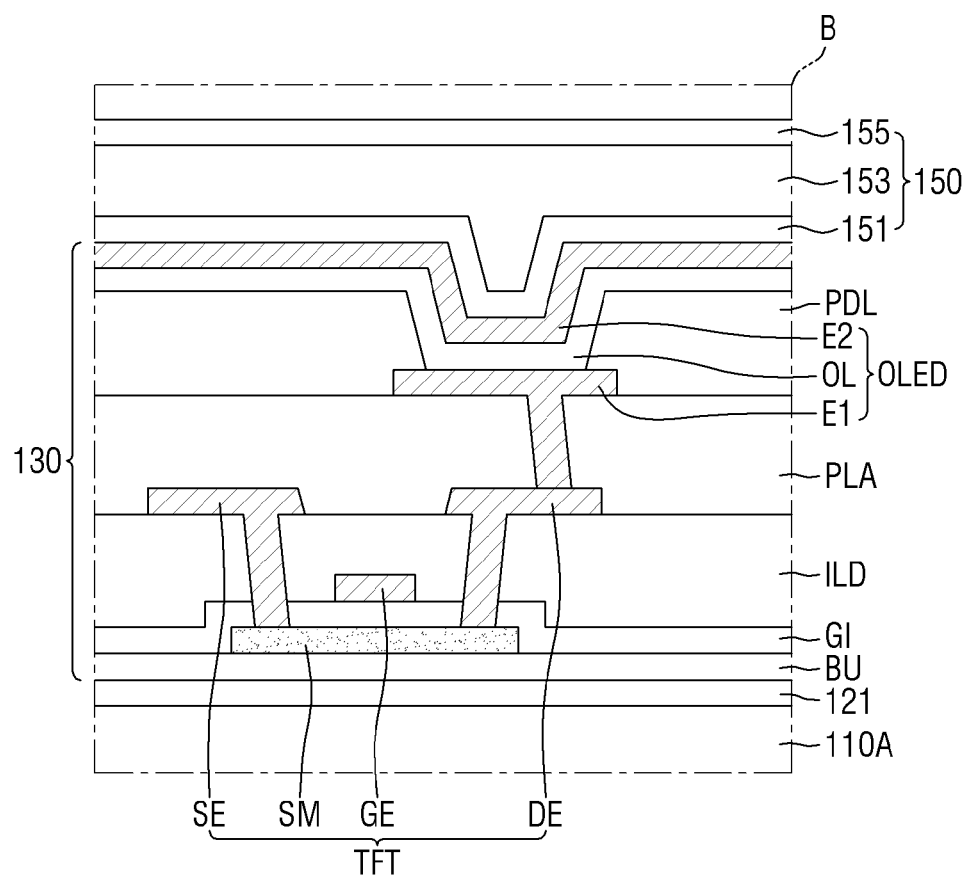
FIG. 3 is an enlarged cross-sectional view of area B in FIG. 2.

FIG. 1 is a plan view of an embodiment of a display device 1, FIG. 2 is a cross-sectional view of the display device 1 taken along line II-IP of FIG. 1, and FIG. 3 is an enlarged cross-sectional view of area B in FIG. 2.

Referring to FIGS. 1 to 3, a display device 1 includes a display area DA and a non-display area NDA which is adjacent to the display area DA. In an embodiment, the display area DA may be around or surround the non-display area NDA, without being limited thereto. The display area DA is a planar area in which an image is displayed, and the non-display area NDA is a planar area in which an image is not displayed.

The display device 1 may include a substrate 110, a display unit 130 and a driving circuit chip 200. The display device 1 may further include a circuit board unit 300 and an encapsulation unit 150 (e.g., encapsulation layer).

The substrate 110 may be an insulating substrate. As an example, the substrate 110 may include a polymer material having flexibility. Here, the polymer material may include polyimide ("PI"), polyethersulphone ("PES"), polyacrylate ("PA"), polyarylate ("PAR"), polyetherimide ("PEI"), polyethylenenaphthalate, ("PEN"), polyethyleneterepthalate ("PET"), polyphenylenesulfide ("PPS"), polyallylate, polycarbonate ("PC"), cellulosetriacetate ("CAT"), cellulose acetate propionate ("CAP") or a combination thereof.

The substrate 110 may include a first area 110A (e.g., first planar area) and a second area 110B (e.g., second planar area). The display area DA in which the display unit 130 is disposed may be defined in the first area 110A, and a portion of the non-display area NDA may be defined in the first area 110A. Other portions of the non-display area NDA may be defined in the second area 110B, and the driving circuit chip 200 may be disposed in the second area 110B. The second area 110B may define an end portion of the substrate 110, an end portion of the display device 1, etc. without being limited thereto.

The display unit 130 may be located in the first area 110A of the substrate 110, and the encapsulation unit 150 may be located on the display unit 130, in both the first area 110A and the second area 110B.

The display unit 130 may include a thin film transistor TFT, which is a switching element, and a light emitting element OLED which is connected to the thin film transistor TFT. The display unit 130 may further include a buffer layer BU, a gate insulating film GI (e.g., gate insulating layer), an interlayer insulating film ILD (e.g., interlayer insulating layer), a planarization layer PLA, a pixel defining layer PDL, and a signal line provided in plural including signal lines such as a gate line (not shown) and a data line (not shown). An electrical signal (e.g., control signal, driving signal, date signal, etc.) may be transmitted by a signal line.

The buffer layer BU may be located on the substrate 110 at the first area 110A of the substrate 110. The buffer layer BU may reduce or effectively prevent the diffusion of impurity ions or the penetration of moisture or outside air, and may perform a surface planarization function. The buffer layer BU may include silicon nitride, silicon oxide or silicon oxynitride. In an embodiment, the buffer layer BU may be omitted depending on process conditions in providing the display device 1.

A semiconductor layer SM of the thin film transistor TFT may be located on the buffer layer BU. The semiconductor layer SM may include single crystalline silicon, low-temperature polycrystalline silicon or amorphous silicon. However, the invention is not limited thereto. In an embodiment, the semiconductor layer SM may include ITZO as an oxide containing indium, tin and titanium or IGZO as an oxide containing indium, gallium or tin.

The gate insulating film GI may be located on the semiconductor layer SM. The gate insulating film GI may include an inorganic material. The inorganic material may include, for example, silicon oxide, silicon nitride, silicon oxynitride, aluminum oxide, tantalum oxide, hafnium oxide, zirconium oxide or titanium oxide.

A gate electrode GE of the thin film transistor TFT may be located on the gate insulating film GI. The gate electrode GE may be connected to a gate line (not shown) extending along a first direction DR1 to receive an electrical signal such as a gate signal and/or a gate voltage.

The interlayer insulating film ILD may be located on the gate electrode GE. The interlayer insulating film ILD may include an organic material or an inorganic material, and may be a single-layer film (e.g., single-layer structure) or a multi-layer layer film (e.g., multi-layer structure) including stacked layers of different materials.

A source electrode SE and a drain electrode DE of the thin film transistor TFT may be located on the interlayer insulating film ILD. Each of the source electrode SE and the drain electrode DE may penetrate through the interlayer insulating film ILD and the gate insulating film GI to be connected to the semiconductor layer SM. The source electrode SE and the drain electrode DE may be respectively connected to the semiconductor layer SM at a contact hole extended through a thickness of the interlayer insulating film ILD and/or the gate insulating film GI. The source electrode SE may be connected to a data line (not shown) extending along a second direction DR2 which crosses the first direction DR1 to receive an electrical signal such as a data signal and/or a data voltage.

The semiconductor layer SM, the gate electrode GE, the source electrode SE and the drain electrode DE may together form the thin film transistor TFT, which is a switching element.

The planarization layer PLA may be located on the source electrode SE and the drain electrode DE. In an embodiment, the planarization layer PLA may include or be made of an organic material, but the material thereof is not limited thereto.

A first electrode E1 may be located on the planarization layer PLA. The first electrode E1 may penetrate through the planarization layer PLA to be connected to the drain electrode DE. In an embodiment, the first electrode E1 may be an anode electrode.

The pixel defining layer PDL may be located on the planarization layer PLA. The pixel defining layer PDL defines a pixel opening which partially exposes the first electrode E1 to outside the pixel defining layer PDL. In an embodiment, the pixel defining layer PDL may include or be made of an organic material.

The organic light emitting layer OL (e.g., light emitting layer) may be located on the first electrode E1 which is exposed by the pixel defining layer PDL to outside thereof. In an embodiment, the organic light emitting layer OL may include or be made of a low-molecular-weight organic material or a high-molecular-weight organic material such as poly3,4-ethylenedioxythiophene ("PEDOT"). The organic light emitting layer OL may be a multi-layer film further including at least one of a hole injection layer ("HIL"), a hole transporting layer ("HTL"), an electron transporting layer ("ETU) and an electron injection layer ("EIL").

A second electrode E2 may be located on the organic light emitting layer OL and the pixel defining layer PDL. The second electrode E2 faces the first electrode E1 with the organic light emitting layer OL and portions of the pixel defining layer PDL therebetween. In an embodiment, the second electrode E2 may be a cathode electrode to which a common power (ELVSS) or common voltage is provided.

The first electrode E1, the organic emission layer OL and the second electrode E2 may together form the light emitting element OLED.

The encapsulation unit 150 may be located on the light emitting element OLED. The encapsulation unit 150 may encapsulate the light emitting element OLED and reduce or effectively prevent the introduction of moisture or the like into the light emitting element OLED from outside thereof. In an embodiment, the encapsulation unit 150 may completely surround the display unit 130, such as in a plan view.

The encapsulation unit 150 may include or be formed as a thin film encapsulation, and may include at least one organic layer and at least one inorganic layer. Illustratively, the encapsulation unit 150 may include a first inorganic layer 151 located on the second electrode E2, an organic layer 153 located on the first inorganic layer 151, and a second inorganic layer 155 located on the organic layer 153. That is, the first inorganic layer 151, the organic layer 153 and the second inorganic layer 155 may be in order from the first electrode E1.

The first inorganic layer 151 may reduce or effectively prevent moisture, oxygen or the like from penetrating into the light emitting element OLED. The first inorganic layer 151 may include or be made of silicon nitride, aluminum nitride, zirconium nitride, titanium nitride, hafnium nitride, tantalum nitride, silicon oxide, aluminum oxide, titanium oxide, tin oxide, cerium oxide or silicon oxynitride (SiON).

The organic layer 153 may improve flatness or planarize a profile defined by underling layers. The organic layer 153 may include be formed of a liquid organic material, for example, acrylic resin, methacrylic resin, polyisoprene, vinyl resin, epoxy resin, urethane resin, cellulose resin or perylene resin.

The second inorganic layer 155 may perform a role substantially the same as or similar to that of the first inorganic layer 151, and may include be formed of a material substantially the same or similar to that of the first inorganic layer 151. The second inorganic layer 155 may completely cover the organic layer 153. In an embodiment, the second inorganic layer 155 and the first inorganic layer 151 may contact each other in the non-display area NDA to form an inorganic-inorganic junction.

The driving circuit chip 200 may be coupled to the substrate 110 at the second area 110B of the substrate 110. The driving circuit chip 200 may include a driving chip 210, a conductive bump such as an output bump 220 connected to the driving chip 210, and a conductive bump such as an input bump 230 spaced apart from the output bump 220 and connected to the driving chip 210.

In an embodiment, the driving chip 210 may be a data driver integrated circuit ("IC") that provides a data signal or the like for driving the display unit 130.

The output bump 220 may output a driving signal for driving the display unit 130, and the input bump 230 may receive a control signal and power provided from the circuit board unit 300. That is, the driving circuit chip 200 includes the output bump 220 through which an electrical signal is output from the driving circuit chip 200 to outside thereof (e.g., the display unit 130) and the input bump 230 through which an electrical signal is input to the driving circuit chip 200 from outside thereof (e.g., circuit board unit 300).

The output bump 220 may be provided in plural including a plurality of output bumps 220 arranged along the first direction DR1 and/or the second direction DR2, respectively corresponding to a conductive pad such as an output pad 170 among a plurality of conductive pads such as output pads 170, and may be spaced apart from the input bump 230 along the second direction DR2.

The input bump 230 may be provided in plural including a plurality of input bumps 230 arranged along the first direction DR1 and respectively corresponding to a conductive pad such as an input pad 180 among a plurality of conductive pads such as input pads 180.

The output pad 170 and the input pad 180 may be located on the substrate 110 at the second area 110B of the substrate 110. In an embodiment, a plurality of output pads 170 may be provided along the first direction DR1 and/or the second direction DR2, and may be spaced apart from the input pad 180 along the second direction DR2. A plurality of input pads 180 may be provided along the first direction DR1. The output pad 170 and the input pad 180 may be electrically connected to the driving circuit chip 200.

A first wiring unit 121 (e.g., first signal wire) electrically connects the output pad 170 and the display unit 130 to each other and may be located on the substrate 110. The first wiring unit 121 may be located on the substrate 110 at the first area 110A as well as the second area 110B of the substrate 110.

The circuit board unit 300 is connected to an external system and a power supply unit (not shown). The external system and/or the power supply unit may be external to the display device 1 without being limited thereto. The circuit board unit 300 supplies a control signal and/or a power to the display unit 130 and to the driving circuit chip 200. The circuit board part 300 is located on the substrate 110 at the second area 110B of the substrate 110 and is further away from the display area DA than the driving circuit chip 200.

In an embodiment, the circuit board unit 300 may include a circuit board 310 and a circuit bump 320 which is connected to the circuit board 310.

The circuit board 310 may be a printed circuit board, and may be rigid or flexible. In an embodiment, a first portion of the circuit board 310 may be rigid, and a second portion of the circuit board 310 which is different from the first portion may be flexible.

A circuit pad 190 may be further located on the substrate 110 at the second area 110B of the substrate 110, and the circuit pad 190 may be electrically connected to the circuit board unit 300. In an embodiment, the output pad 170 and the input pad 180, as compared with the circuit pad 190, may be located closer to the display area DA. That is, the output pad 170, the input pad 180 and the circuit pad 190 may be in order from the display area DA. In addition, a second wiring unit 122 (e.g., second signal wire) electrically connects the input pad 180 and the circuit pad 190 to each other, and may be located on the substrate 110 at the second area 110B of the substrate 110. In an embodiment, the circuit pad 190 may be provided in plural including a plurality of circuit pads 190 arranged along the first direction DR1 and respectively corresponding to the circuit bump 320 among a plurality of circuit bumps 320.

The output pad 170 is a portion of the display device 1 which receives a driving signal output from the driving circuit chip 200. The driving signal output from the driving circuit chip 200 may be provided to the display unit 130 via the output pad 170 and the first wiring unit 121 in order.

The input pad 180 may be a portion of the display device 1 which transmits a control signal and a power provided from the circuit board unit 300 to the driving circuit chip 200. The circuit pad 190 may be a portion of the display device which receives a control signal and a power provided from the circuit board unit 300.

The control signal and power provided from the circuit board unit 300 may be provided to the driving circuit chip 200 via the circuit pad 190, the second wiring unit 122 and the input pad 180 in order.

The output pad 170 may be electrically connected to the output bump 220 of the driving circuit chip 200. The output pad 170 may be disposed to overlap or correspond to the output bump 220 along a third direction DR3 which crosses each of the first direction DR1 and the second direction DR2. A thickness direction of the display device 1 and elements thereof may be defined along the third direction DR3. The input pad 180 may be electrically connected to the input bump 230. The input pad 180 may be disposed to overlap or correspond to the input bump 230 in the third direction DR3. The corresponding conductive pads and conductive bumps may be aligned with each other along the third direction DR3, without being limited thereto.

An adhesive member ADF (e.g., adhesive pattern) may be interposed between the output pad 170 and the output bump 220. The adhesive member ADF may also be interposed between the input pad 180 and the input bump 230. Hereinafter, an embodiment of a display device 1 which includes the adhesive member ADF will be described in detail with reference to FIGS. 4 to 10.

Figure 4:
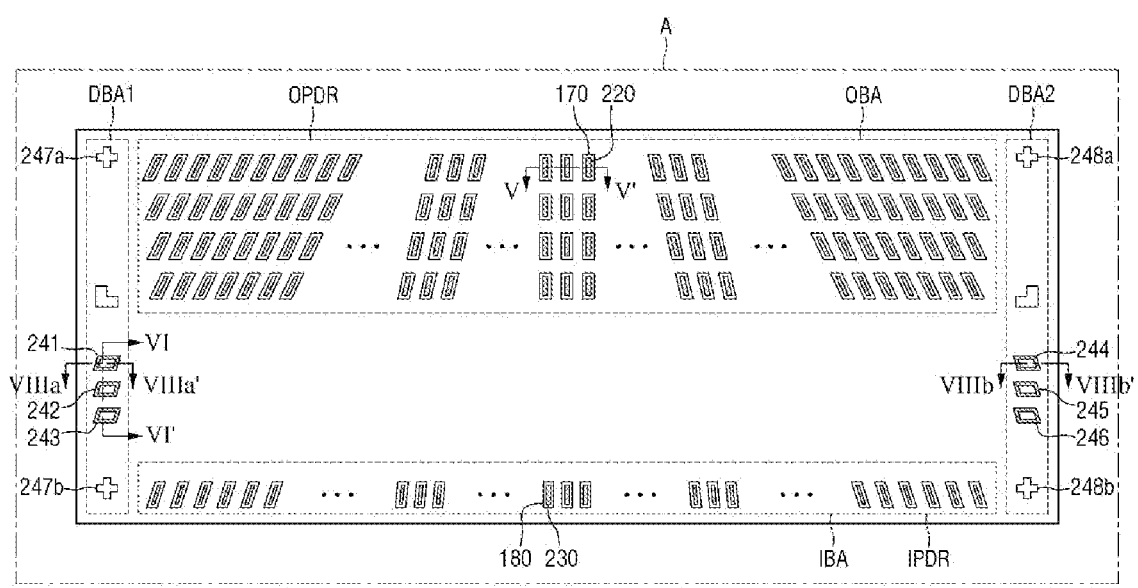
FIG. 4 is an enlarged plan view of area A in FIG. 1.
Figure 5:
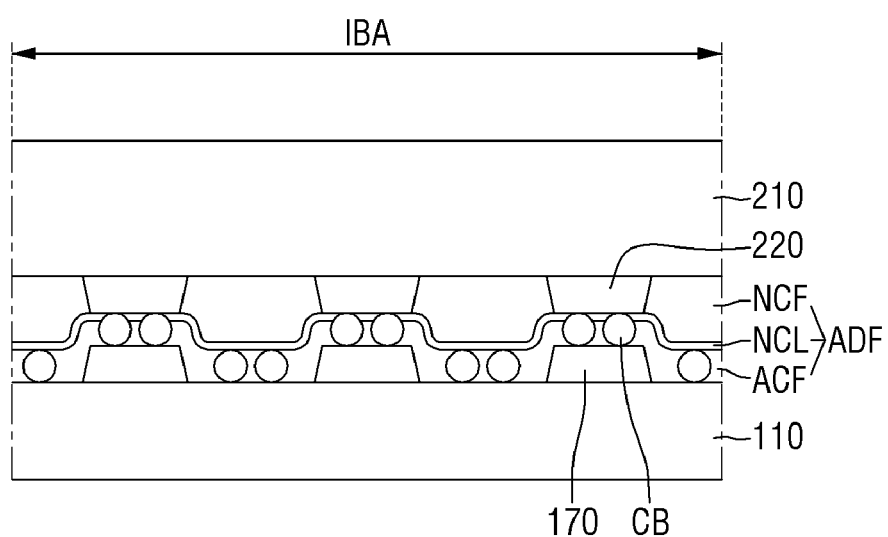
FIG. 5 is an enlarged cross-sectional view of the display device taken along line V-V' of FIG. 4.
Figure 6:
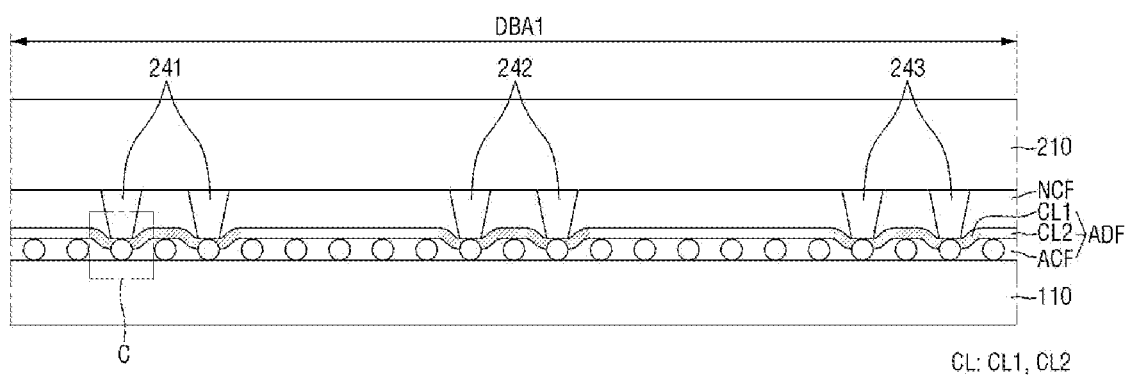
FIG. 6 is an enlarged cross-sectional view of the display device taken along line VI-VI' of FIG. 4.
Figure 7:
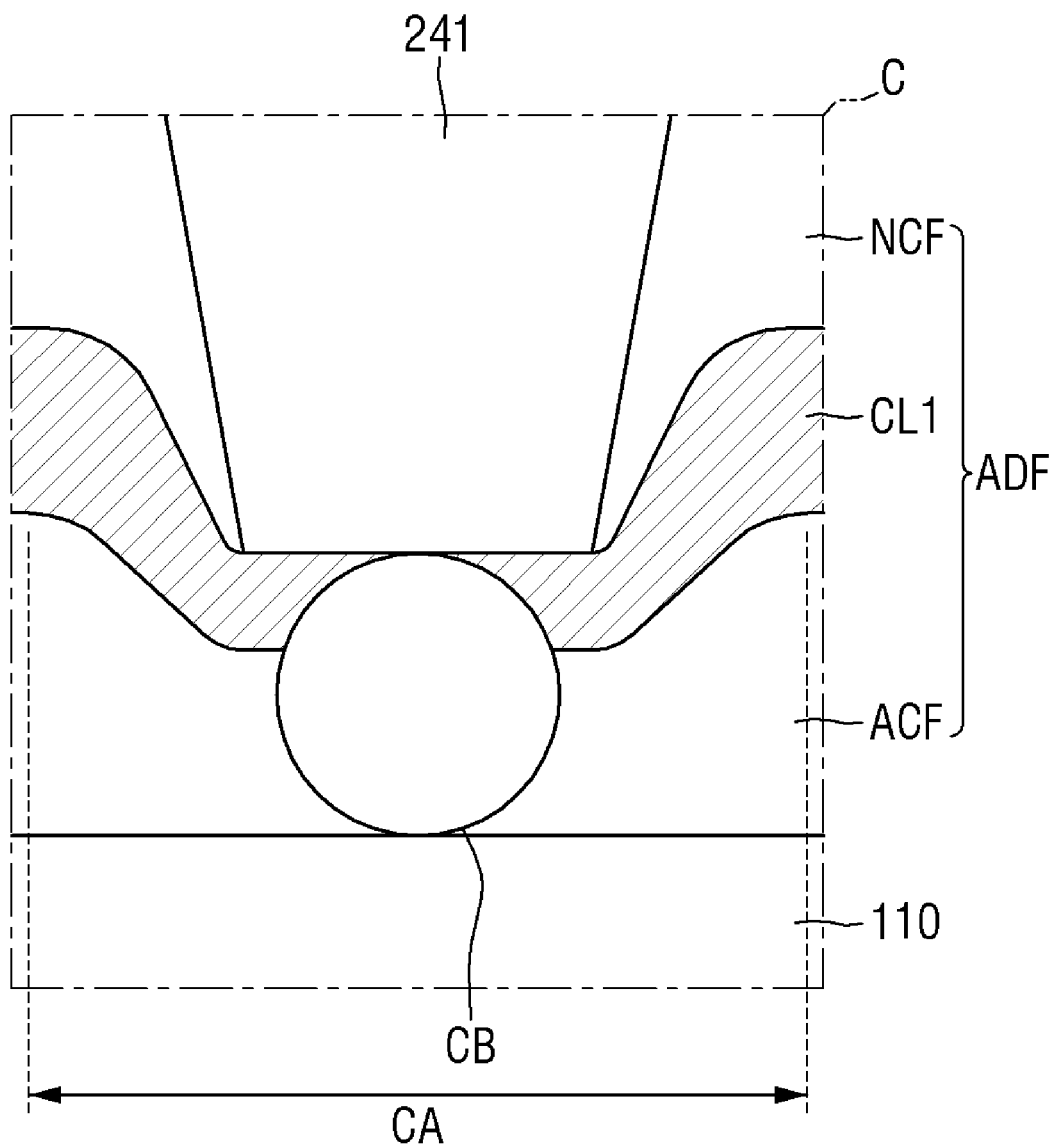
FIG. 7 is an enlarged cross-sectional view of area C in FIG. 6.
Figure 8:
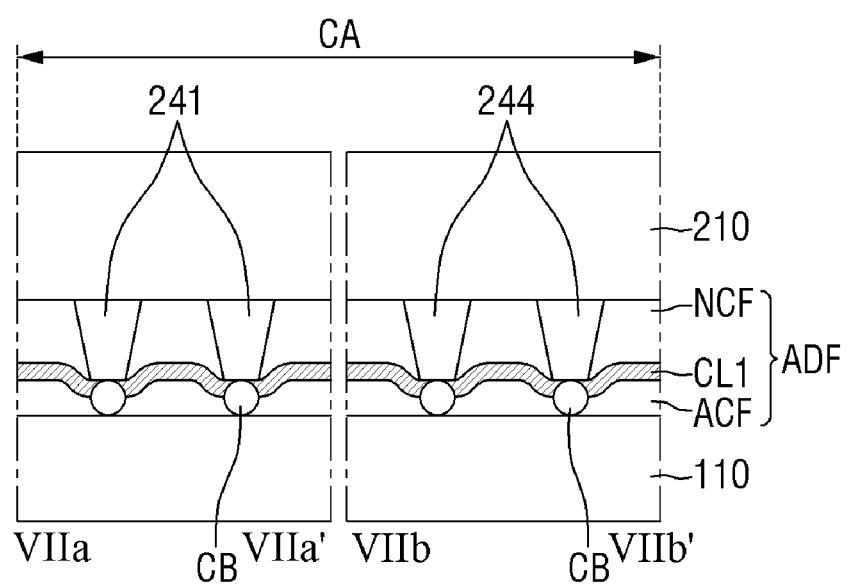
FIG. 8 is an enlarged cross-sectional view of the display device taken along lines VIIIa-VIIIa' and VIIIb-VIIb' of FIG. 4.
Figure 9:
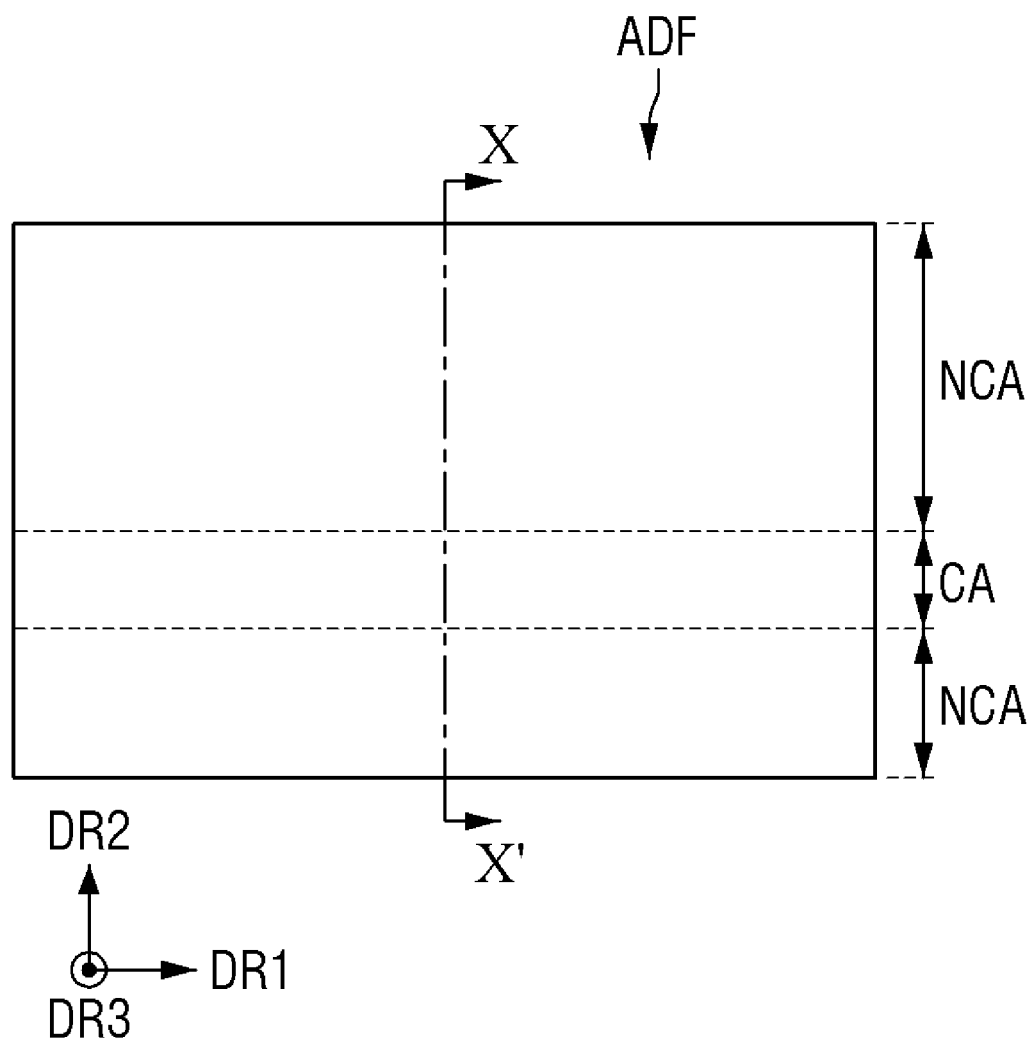
FIG. 9 is a plan view of an embodiment of an adhesive member.
Figure 10:
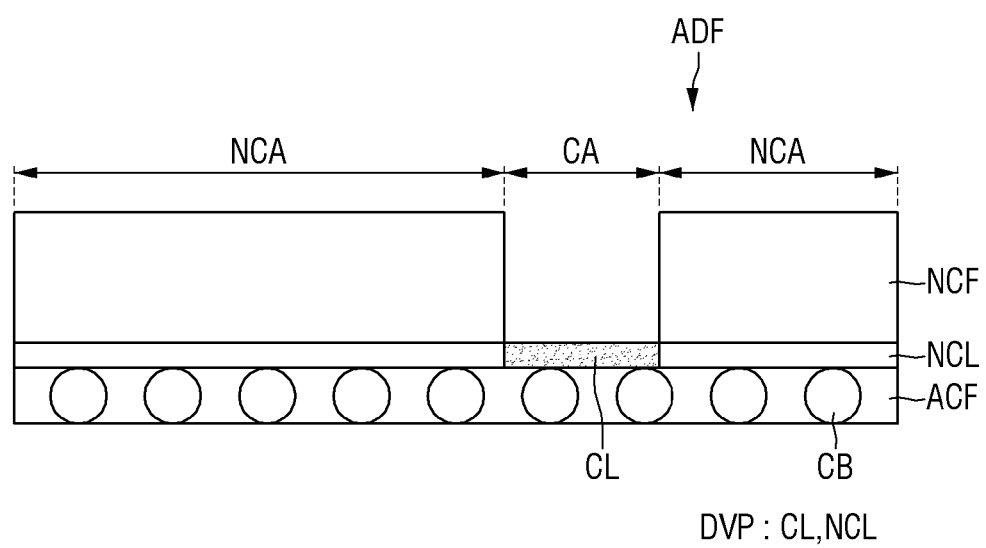
FIG. 10 is a cross-sectional view of the adhesive member taken along line X-X' of FIG. 9.

FIG. 4 is an enlarged plan view of the area A in FIG. 1, FIG. 5 is a cross-sectional view of the display device taken along line V-V' of FIG. 4, FIG. 6 is a cross-sectional view of the display device taken along line VI-VI' of FIG. 4, FIG. 7 is an enlarged plan view of the area C in FIG. 6, FIG. 8 is an enlarged cross-sectional view of the display device 1 taken along lines VIIIa-VIIIa' and VIIIb-VIIb' of FIG. 4, FIG. 9 is a plan view of an embodiment of an adhesive member ADF, and FIG. 10 is an enlarged cross-sectional view of the adhesive member ADF taken along line X-X' of FIG. 9.

Referring to FIGS. 4 to 10, the substrate 110 of the display device 1 may include an input pad unit IPDR (e.g., input pad area) and an output pad unit OPDR (e.g., output pad area). The driving circuit chip 200 may include an input bump unit IBA (e.g., input bump area), an output bump unit OBA (e.g., output bump area) and a dummy bump unit (e.g., dummy bump area).

The output pad unit OPDR includes a plurality of output pads 170. Specifically, the output pad unit OPDR may include a plurality of output pads 170 arranged along the first direction DR1.

The output pad unit OPDR may receive various electrical signals output from the driving circuit chip 200 through a plurality of output bumps 220 thereof arranged to correspond to the output pad unit OPDR. The various electrical signals provided to the output pad unit OPDR may be provided to each pixel (not shown) disposed in the display area DA through a plurality of signal lines (not shown) connected to the output pad unit OPDR. Here, since the number of pixels (not shown) controlled by the driving circuit chip 200 is very large, the output pad unit OPDR may include a larger number of output pads 170 than the number of input pads 180 of the input pad unit IPDR.

In an embodiment, the output pads 170 may have the same shape as each other in the plan view, and may be arranged in parallel to each other. That is, the output pads 170 arranged in a same row may be arranged in parallel to each other so as to contact one reference line extending along the row direction. In the embodiment illustrated with reference to this drawing, the row direction may be the same as a direction along which the first direction DR1 extends.

In contrast, the output bump 220 of the driving circuit chip 200 is disposed to correspond to the output pad unit OPDR of the substrate 110. More specifically, each output bump 220 connected to each of an output pad 170 included in the output pad unit OPDR may be disposed to have a specific pattern. That is, a plurality of output bumps 220 may be arranged along the first direction DR1.

However, the output bumps 220 may have the same shape, but may not be arranged in parallel to each other. Specifically, the output bumps 220 arranged in the same row may be arranged to be staggered from each other in a zigzag shape. That is, the output bumps 220 arranged in a same row and adjacent to each other may be arranged to be partially staggered along the second direction DR2.

The output pads 170 are not necessarily arranged in parallel along the first direction DR1, but may be arranged to be staggered along the second direction DR2 between the output pads 170 arranged adjacent to the same row. However, in this case, the length staggered in the second direction DR2 between the output pads 170 arranged adjacent to the same row is shorter than the length staggered in the second direction DR2 between the output bumps 220 arranged corresponding to the output pads 170 and arranged adjacent to the same row.

The output bump unit OBA of the driving circuit chip 200 may include a plurality of output bumps 220. As described above, the output bumps 220 may be disposed to correspond to the output pads 170, respectively. The output bump unit OBA may overlap or correspond to the output pad unit OPDR.

The input pad unit IPDR of the substrate 110 may include a plurality of input pads 180. Specifically, the input pad unit IPDR may include a plurality of input pads 180 arranged in a row along the first direction DR1. The input bumps 230 of the driving circuit chip 200 may be disposed on the input pads 180 to correspond to each other.

The arrangement of the input pads 180 in the input pad unit IPDR is exemplary, and is not limited thereto. In response to the arrangement of the input bumps 230 of the driving circuit chip 200 connected to each of the input pads 180, the arrangement of the input pads 180 may be randomly changed.

Various electrical signals provided from outside of the display device 1 may be provided to the input pad unit IPDR, and the various electrical signals may be provided to the driving circuit chip 200 through the plurality of input bumps 230 arranged to correspond to the input pad unit IPDR.

The input bump unit IBA of the driving circuit chip 200 may include a plurality of input bumps 230. As described above, the input bumps 230 may be arranged to correspond to the input pads 180, respectively. The input bump unit IBA may overlap or correspond to the input pad unit IPDR.

The dummy bump unit of the driving circuit chip 200 may be disposed on each of opposing sides of the output bump unit OBA and the input bump unit IBA along the first direction DR1. The dummy bump unit may include an alignment bump and an inspection bump. The dummy bump unit may include a first dummy bump unit DBA1 disposed on a first side of the output bump unit OBA and the input bump unit IBA in the first direction DR1, and a second dummy bump unit DBA2 disposed on a second side thereof which is opposite to the first side along the first direction DR1. Conductive pads may be absent or omitted at an area corresponding to the dummy bump unit DBA along the third direction DR3. A dummy bump area or dummy area may include the first dummy bump unit DBA1 and the second dummy bump unit DBA2.

The first dummy bump unit DBA1 may include first alignment bumps 247a and 247b and first to third inspection bumps 241, 242 and 243. The second dummy bump unit DBA2 may include second alignment bumps 248a and 248b and fourth to sixth inspection bumps 244, 245 and 246.

The first alignment bumps 247a and 247b may be disposed at a first end and a second end which is opposite to the first end of the first dummy bump unit DBA1 along the second direction DR2, respectively. The second alignment bumps 248a and 248b may be disposed at a first end and a second end which is opposite to the first end of the second dummy bump unit DBA2 along the second direction DR2, respectively. The first alignment bumps 247a and 247b and the second alignment bumps 248a and 248b may be used to align the output bumps 220 and input bumps 230 with the output pads 170 and the input pads 180, respectively, when attaching the driving circuit chip 200 to the substrate 110.

The first to third inspection bumps 241, 242 and 243 and the fourth to sixth inspection bumps 244, 245 and 246 may be used to check flatness when attaching the driving circuit chip 200 to the substrate 110. Although it is illustrated in FIG. 4 that the first dummy bump unit DBA1 includes three inspection bumps, that is, the first to third inspection bumps 241, 242 and 243, the number thereof is not limited thereto. Within the first dummy bump unit DBA1, the first to third inspection bumps 241, 242 and 243 may be arranged along the second direction DR2. Similarly, in the second dummy bump unit DBA2, the fourth to sixth inspection bumps 244, 245 and 246 may be arranged along the second direction DR2.

In an embodiment, the first to third inspection bumps 241, 242 and 243 may be aligned with the fourth to sixth inspection bumps 244, 245 and 246 along the first direction DR1, respectively. Specifically, the first inspection bump 241 may be aligned with the fourth inspection bump 244 along the first direction DR1, the second inspection bump 242 may be aligned with the fifth inspection bump 245 along the first direction DR1, and the third inspection bump 243 may be aligned with the sixth inspection bump 246 along the first direction DR1.

Accordingly, the attachment flatness of the driving circuit chip 200 to the substrate 110 along the first direction DR1 may be checked using the first and fourth inspection bumps 241 and 244. Further, the attachment flatness of the driving circuit chip 200 to the substrate 110 in the first direction DR1 may be checked using the second and fifth inspection bumps 242 and 245. Further, the attachment flatness of the driving circuit chip 200 to the substrate 110 in the first direction DR1 may be checked using the third and sixth inspection bumps 243 and 246.

In an embodiment, each of the first to sixth inspection bumps 241 to 246 may have a closed curve shape including an opening therein. A protruded portion of a respective inspection bump may define the opening. The protruded portion may be a solid portion of the inspection bump. The opening of each of the first to sixth inspection bumps 241 to 246 may expose at least a part of one surface of the driving circuit chip 200 to outside a respective inspection bump.

The surface of the driving circuit chip 200 which is exposed may be defined by the driving chip 210. Referring to FIG. 6, for example, each of the first to third inspection bumps 241, 242 and 243 has a protruded portion extending from the driving chip 210 of the driving circuit chip 200. In an embodiment, the display device 1 includes a driving chip 210 facing the substrate 110 and including a conductive bump electrically connected to the conductive pad, and an inspection bump which is insulated from the conductive pad, the inspection bump having a closed curve shape defining an opening of the inspection bump.

An adhesive member ADF may be disposed between the substrate 110 and the driving circuit chip 200. The adhesive member ADF may include a first adhesive layer ACF, a second adhesive layer DVP disposed on the first adhesive layer ACF and including a coloring portion CL (e.g., color-changing portion) and a non-coloring portion NCL (e.g., non-color changing portion), and a third adhesive layer NCF disposed on the second adhesive layer DVP. The second adhesive layer DVP may be color-changeable at the coloring portion CL. In an embodiment, the adhesive member ADF includes a first adhesive layer ACF which electrically connects a driving chip 210 of a display device 1 to a conductive pad of a substrate 110 of the display device 1, and a second adhesive layer DVP facing the first adhesive layer ACF, where the second adhesive layer includes a first portion corresponding to an inspection bump of the driving chip 210 which is insulated from the conductive pad of the substrate 110, the first portion including a color-changing material, and a second portion corresponding to the conductive pad of the substrate 110, where the second portion excludes the color-changing material.

The first adhesive layer ACF may be disposed on the substrate 110. The first adhesive layer ACF may be disposed so as to overlap an entirety of the driving circuit chip 200. The first adhesive layer ACF may be disposed to cover the output pad 170 and the input pad 180.

The first adhesive layer ACF may include a conductive ball CB (e.g., conductive material or conductive member). The first adhesive layer ACF may include a first adhesive material having a first modulus (e.g., modulus of elasticity or elastic modulus) greater than a second modulus of a second adhesive material of the third adhesive layer NCF to be described later. The conductive ball CB included in the first adhesive layer ACF may be disposed between the output pad 170 and the output bump 220. One side of the conductive ball CB disposed between the output pad 170 and the output bump 220 may directly contact the output pad 170, and the other side thereof may directly contact the output bump 220. As being in contact, elements may form an interface therebetween. Further, the conductive ball CB included in the first adhesive layer ACF may be disposed between the input pad 180 and the input bump 230. One side of the conductive ball CB disposed between the input pad 180 and the input bump 230 may directly contact the input pad 180, and the other side thereof may directly contact the input bump 230. In an embodiment, for example, the first adhesive layer ACF may be an anisotropic conductive film ("ACF").

The second adhesive layer DVP may be disposed on the first adhesive layer ACF. The second adhesive layer DVP may include a coloring portion CL including a color former (e.g., a color-changing material which imparts a color to the second adhesive layer DVP) and a non-coloring portion NCL which excludes a color former. The second adhesive layer DVP may cover an entirety of the adhesive member ADF. The adhesive member ADF may include a coloring area CA (e.g., color-changeable area) in which the coloring portion CL is disposed and a non-coloring area NCA (e.g., non-color changeable area) in which the non-coloring portion NCL is disposed.

The coloring portion CL may be disposed in the coloring area CA. In an embodiment, the coloring area CA may have a shape extending along the first direction DR1. The coloring portion CL may include at least one of a pressure-sensitive color former that changes color when subjected to pressure and a heat-sensitive color former that changes color when subjected to heat, but the invention is not limited thereto. The color former may have a capsule shape having a dimension such as a diameter of several to tens of micrometers (μm), but the invention is not limited thereto. The changed color of the coloring portion CL may be proportional to an amount of pressure and/or heat (e.g., force) applied thereto. In an embodiment, a stronger or darker color may correspond to a larger force applied to the coloring portion CL which provides more attachment flatness, while a weaker or lighter color may correspond to a smaller force applied to the coloring portion CL which provides less attachment flatness.

The non-coloring portion NCL may be disposed in the non-coloring area NCA. The non-coloring area NCA may be disposed at each of opposing sides of the coloring portion CL along the second direction DR2 with the coloring portion CL interposed therebetween. That is, the coloring portion CL may be disposed between two of the non-coloring portion NCL which are spaced apart from each other, but the invention is not limited thereto.

The second adhesive layer DVP may include a parent material on which a color former is disposed. The second adhesive layer DVP may include a salicylic acid metal salt. In an embodiment, for example, the color portion CL may include a salicylic acid metal salt and a color former.

The third adhesive layer NCF may be disposed on the second adhesive layer DVP. The third adhesive layer NCF faces the first adhesive layer ACF with the second adhesive layer DVP therebetween. The third adhesive layer NCF may have a second modulus smaller than the first modulus of the above-described first adhesive layer ACF. Since the third adhesive layer NCF has a relatively small modulus, the third adhesive layer NCF may be widely spread along the substrate 110 during the attaching process, thereby improving the adhesion of the adhesive member ADF. Further, the third adhesive layer NCF may cover and protect the first adhesive layer ACF and the second adhesive layer DVP. The third adhesive layer NCF may not include a conductive ball CB, but the invention is not limited thereto.

In an embodiment, the third adhesive layer NCF may be disposed in the non-coloring area NCA, and may be excluded from the coloring area CA. Accordingly, the upper surface of the coloring portion CL disposed in the coloring area CA may be exposed to outside the third adhesive layer NCF.

Referring to FIG. 5, the adhesive member ADF including the first adhesive layer ACF including the conductive ball CB, the non-coloring portion NCL of the second adhesive layer DVP disposed on the first adhesive layer ACF, and the third adhesive layer NCF disposed on the non-coloring portion NCL may be disposed between the output pad unit OPDR and the output bump unit OBA. The first adhesive layer ACF, the second adhesive layer DVP and the third adhesive layer NCF may be disposed in order from the substrate 110 to the driving circuit chip 200. The conductive ball CB may be disposed between the output pad 170 and the output bump 220. One side of the conductive ball CB may contact the output pad 170, and the other side thereof which is opposite to the one side may contact the output bump 220. Although it is shown in FIG. 5 that two of the conductive balls CB are disposed between the output pad 170 and the output bump 220, the number of the conductive balls CB disposed between the output pad 170 and the output bump 220 is not limited thereto.

Referring to FIG. 5, within the output area (e.g., planar area including the output bump unit OBA and the output pad unit OPDR), the non-coloring portion NCL may be disposed to surround the conductive ball CB disposed between the output pad 170 and the output bump 220. The third adhesive layer NCF may be disposed to surround the conductive ball CB disposed between the output pad 170 and the output bump 220. The first adhesive layer ACF may be disposed between the output pads 170 disposed adjacent to each other along the substrate 110, but the invention is not limited thereto. The third adhesive layer NCF may be disposed between the output bumps 220 disposed adjacent to each other, but the invention is not limited thereto. The coloring portion CL of the second adhesive layer DVP may be excluded from the output area.

Although not shown, the same type of adhesive member ADF may be disposed between the input pad unit IPDR and the input bump unit IBA (e.g., input area as planar area including the input pad unit IPDR and the input bump unit IBA). The adhesive member ADF including the first adhesive layer ACF including the conductive ball CB, the non-coloring portion NCL of the second adhesive layer DVP disposed on the first adhesive layer ACF, and the third adhesive layer NCF disposed on the non-coloring portion NCL may be disposed between the input pad unit IPDR and the input bump unit IBA. Taking FIGS. 2 and 5 together, for example, the first adhesive layer ACF may be disposed closer to the substrate 110 than the third adhesive layer NCF, and the third adhesive layer NCF may be disposed closer to the driving circuit chip 200 than the first adhesive layer ACF. The conductive ball CB may be disposed between the input pad 180 and the input bump 230. One side of the conductive ball CB may contact the input pad 180, and the other side thereof may contact the input bump 230. The non-coloring portion NCL of the second adhesive layer DVP may be disposed to surround the conductive ball CB disposed between the input pad 180 and the input bump 230. The third adhesive layer NCF may be disposed to surround the conductive ball CB disposed between the input pad 180 and the input bump 230. The first adhesive layer ACF may be disposed between the input pads 180 disposed adjacent to each other, but the invention is not limited thereto. The third adhesive layer NCF may be disposed between the input bumps 230 disposed adjacent to each other, but the invention is not limited thereto. The coloring portion CL of the second adhesive layer DVP may be excluded from the input area.

Referring to FIG. 6, the adhesive member ADF including the first adhesive layer ACF including the conductive ball CB, the coloring portion CL of the second adhesive layer DVP disposed on the first adhesive layer ACF, and the third adhesive layer NCF disposed on the coloring portion CL may be disposed between the first dummy bump unit DBA1 of the driving circuit chip 200 and the substrate 110. The non-coloring portion NCL of the second adhesive layer DVP may be excluded from the dummy area. The first adhesive layer ACF may be disposed on the substrate 110, and the third adhesive layer NCF may be disposed on the lower surface of the driving circuit chip 200. The conductive ball CB may be disposed between each of the first to third inspection bumps 241, 242 and 243, and the substrate 110, respectively. One side of the conductive ball CB may contact the substrate 110, and the other side thereof may contact a distal end of each of the first to third inspection bumps 241, 242 and 243. The distal end may be an end of an inspection bump which is closest to the substrate 110.

The coloring portion CL disposed between the first dummy bump unit DBA1 and the substrate 110 may include a first coloring portion CL1 at which color of the second adhesive layer DVP changes due to heat or pressure applied thereto, and a second coloring portion CL2 at which color of the second adhesive layer DVP does not change by heat or pressure applied thereto.

The first coloring portion CL1 may be a portion of the second adhesive layer DVP where color of the second adhesive layer DVP changes due to the pressure applied thereto. The pressure may be provided by a force applied between the substrate 110 and the first to third inspection bumps 241, 242 and 243, respectively, along the thickness direction and with the conductive ball CB therebetween. The first coloring portion CL1 may overlap or correspond to the first to third inspection bumps 241, 242 and 243 along the thickness direction of the coloring portion CL. The first coloring portion CL1 may correspond to locations of the first to third inspection bumps 241, 242 and 243 along the substrate 110. The first coloring portion CL1 may be disposed to surround the conductive ball CB disposed between each of the first to third inspection bumps 241, 242 and 243 and the substrate 110, respectively. In the plan view, the first coloring portion CL1 may be disposed to surround each of the first to third inspection bumps 241, 242 and 243.

In the plan view, the first coloring portion CL1 may extend both outward and inward from the protruded portion (e.g., solid portion) of a respective inspection bump. Referring to FIG. 6, for example, the first coloring portion CL1 (e.g., indicated by a hatched pattern) may be disposed even in the opening of each of the first to third inspection bumps 241, 242 and 243. The second coloring portion CL2 may be extended from the first coloring portion CL1 and along the substrate 110. The second coloring portion CL2 may define a remainder of the coloring portion CL at the dummy area. The first coloring portion CL1 may extend outward from the protruded portion by a distance along the substrate 110 to define patterns of the first coloring portion CL1 which are spaced apart from each other along the second adhesive layer DVP.

The third adhesive layer NCF may be disposed between the first to third inspection bumps 241, 242 and 243 disposed adjacent to each other along the substrate 110. Further, the third adhesive layer NCF may also be interposed in the opening of each of the first to third inspection bumps 241, 242 and 243, but the invention is not limited thereto.

Although not shown, the same type of adhesive member ADF may be disposed between the second dummy bump unit DBA2 and the substrate 110.

Specifically, the adhesive member ADF including the first adhesive layer ACF including the conductive ball CB, the coloring portion CL disposed on the first adhesive layer ACF, and the third adhesive layer NCF disposed on the coloring portion CL may be disposed between the second dummy bump unit DBA2 and the substrate 110. The first adhesive layer ACF may be disposed on the substrate 110, and the third adhesive layer NCF may be disposed on the lower surface of the driving circuit chip 200. The conductive ball CB may be disposed between each of the fourth to sixth inspection bumps 244, 245 and 246 and the substrate 110, respectively. One side of the conductive ball CB may contact the substrate 110, and the other side thereof may contact the distal end of each of the fourth to sixth inspection bumps 244, 245 and 246.

The coloring portion CL disposed between the second dummy bump unit DBA2 and the substrate 110 may include a first coloring portion CL1 at which color of the second adhesive layer DVP changes due to heat or pressure applied thereto and a second coloring portion CL2 at which color of the second adhesive layer DVP is not changed due to heat or pressure.

The first coloring portion CL1 may be a portion of the second adhesive layer DVP where color thereof changes due to the pressure applied thereto from a force applied between the substrate 110 and the fourth to sixth inspection bumps 244, 245, and 246, respectively, along the thickness direction. The first coloring portion CL1 may overlap or correspond to locations of the first to third inspection bumps 241, 242 and 243 along the substrate 110. The first coloring portion CL1 may be disposed to surround the conductive ball CB disposed between each of the fourth to sixth inspection bumps 244, 245 and 246 and the substrate 110, respectively. In the plan view, the first coloring portion CL1 may be disposed to surround each of the fourth to sixth inspection bumps 244, 245 and 246. The first coloring portion CL1 may be disposed even in the opening of each of the fourth to sixth inspection bumps 244, 245 and 246.

The third adhesive layer NCF may be disposed between the fourth to sixth inspection bumps 244, 245 and 246 disposed adjacent to each other. Further, the third adhesive layer NCF may also be interposed in the opening of each of the fourth to sixth inspection bumps 244, 245 and 246, but the invention is not limited thereto.

Attachment flatness of the driving circuit chip 200 relative to elements on the substrate 110 may be checked within the display device 1 including the adhesive member ADF. The adhesive member ADF may include a color former, the color of which is changeable when subjected to heat or pressure. Attachment flatness of objects to be attached to each other within the display device 1 may be checked by observing the color change of the color former included in the adhesive member ADF.

Referring to FIGS. 4 through 10 described above, the attachment flatness of the driving circuit chip 200 to the substrate 110 along the first direction DR1 has been described as a main example, but the invention is not limited thereto, and the direction of attachment flatness and the condition of the attachment flatness are not limited thereto. In an embodiment, for example, the attachment flatness of the circuit board unit 300 to the substrate 110 may also be checked.

Figure 11:
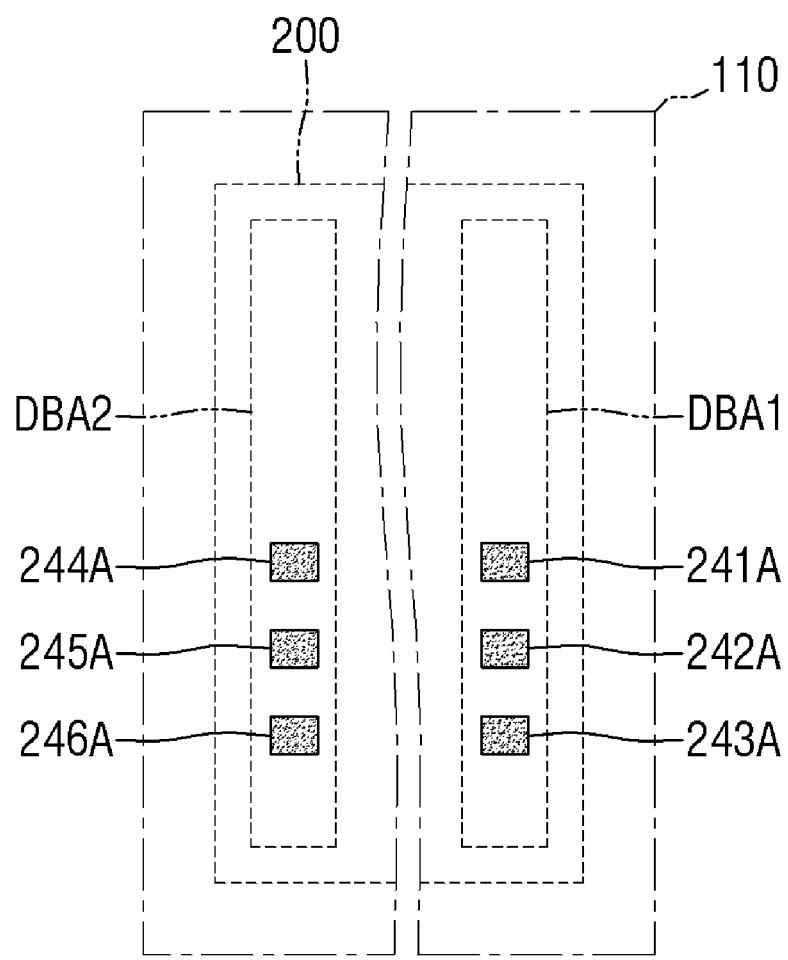
FIGS. 11 and 12 are embodiments of attachment flatness within a display device.
Figure 12:
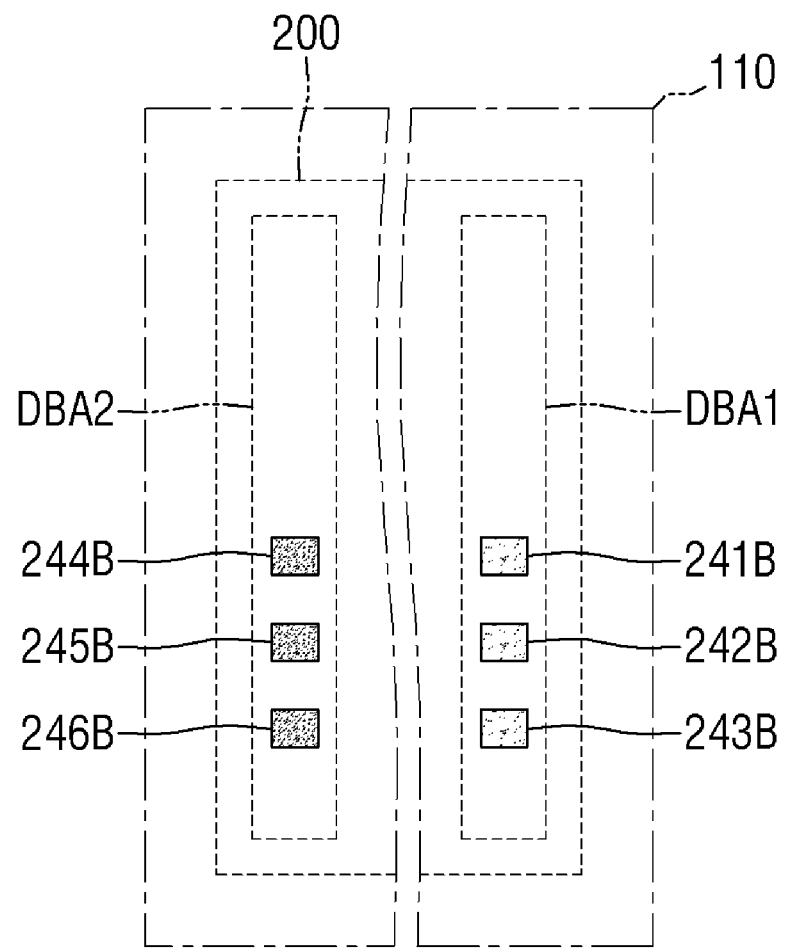

FIGS. 11 and 12 are embodiments of the display device 1 related to attachment flatness of the driving circuit chip 200 to the substrate 110 along the first direction DR1.

Hereinafter, embodiments in which the attachment flatness of the driving circuit chip 200 to the substrate 110 in the first direction DR1 is compared will be described with reference to FIGS. 11 and 12. FIGS. 11 and 12 are plan views of the rear of the substrate 110 to which the driving circuit chip 200 is attached.

Referring to FIGS. 11 and 12, the rear surface of the substrate 110 to which the driving circuit chip 200 is attached may include first to sixth inspection bump areas 241A to 246A. The first to sixth inspection bump areas 241A to 246A may have a planar shape corresponding to a shape of the first coloring portion CL1 of the second adhesive layer DVP at the first to sixth inspection bumps 241 to 246 which is visible at the rear surface of the substrate 110 due to the transparency of the substrate 110. That is, the first to sixth inspection bump areas 241A to 246A may be planar areas corresponding to portions of the second adhesive layer DVP which have been color-changed to define the first coloring portion CL1 due to the pressure applied to the coloring portion CL, and which are visible at the rear surface of the substrate 110 when the first to sixth inspection bump areas 241A to 246A are flatly attached onto the substrate 110.

FIG. 11 is a view illustrating the driving circuit chip 200s flatly attached to the substrate 110 along the first direction DR1. Colors visible at the first inspection bump area 241A and the fourth inspection bump area 244A may be substantially the same as each other. Colors visible at the second inspection bump area 242A and the fifth inspection bump area 245A may be substantially the same as each other. Colors visible at the third inspection bump area 243A and the sixth inspection bump area 246A may be substantially the same as each other. Since FIG. 11 shows that the colors visible at the inspection bump areas adjacent along the first direction DR1 are substantially the same as each other, the driving circuit chip 200 is flatly attached to the substrate 110 along the first direction DR1.

First to third inspection bumps 241, 242 and 243 are arranged along the second direction DR2. Since FIG. 11 shows that the colors visible at the first to third inspection bump areas 241A to 243A are substantially the same as each other, the driving circuit chip 200 is flatly attached to the substrate 110 along the second direction DR2.

FIG. 12 is a view illustrating the driving circuit chip 200 unevenly attached to the substrate 110 along the first direction DR1. The color expressed at the first inspection bump area 241A may be different from the color expressed at the fourth inspection bump area 244A. The color expressed at the second inspection bump area 242A may be different from the color expressed at the fifth inspection bump area 245A. The color expressed in the third inspection bump area 243A may be different from the color expressed at the sixth inspection bump area 246A. In an embodiment, for example, the color change expressed in the first to third test bump areas 241A to 243A may be weaker or lighter than the color change expressed in the fourth to sixth test bump areas 244A to 246A. Accordingly, the differences in color change verifies the driving circuit chip 200 at the side of the second dummy bump unit DBA2 is more strongly pressed and attached to the substrate 110 than the driving circuit chip 200 at the side of the first dummy bump unit DBA1. That is, along the third direction DR3, a distance between the end of the second dummy bump unit DBA2 of the driving circuit chip 200 and the substrate 110 may be smaller than a distance between the end of the first dummy bump unit DBA1 of the driving circuit chip 200 and the substrate 110.

Figure 13:
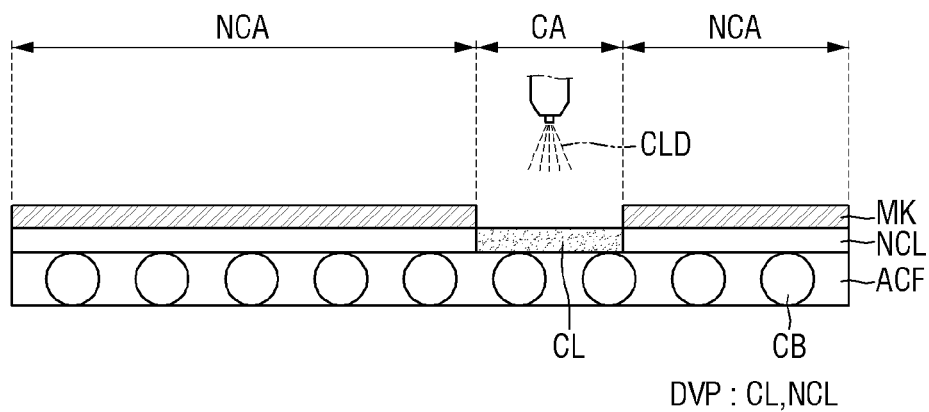
FIGS. 13 and 14 are cross-sectional views illustrating an embodiment of a process of providing an adhesive member.
Figure 14:
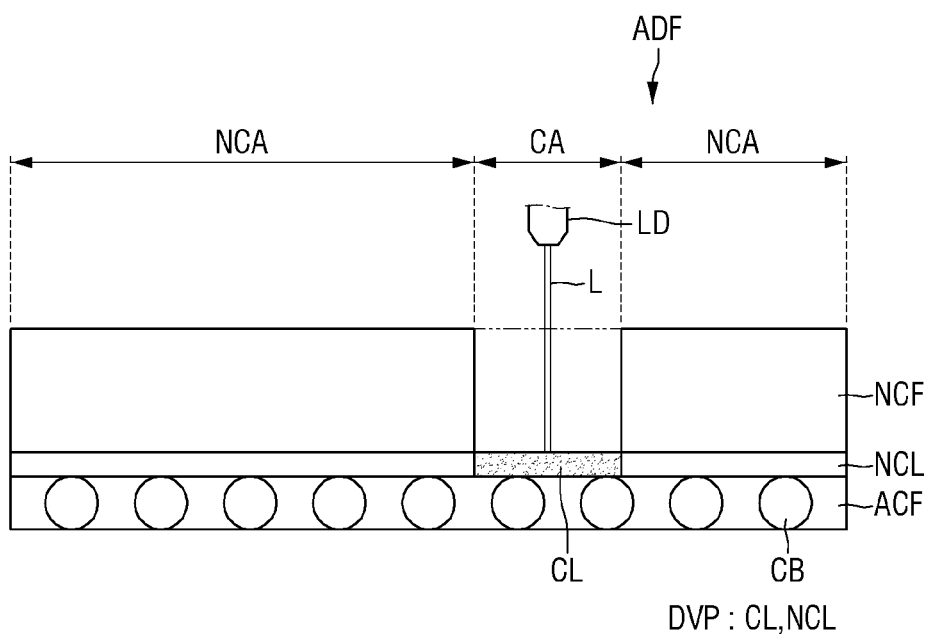

FIGS. 13 and 14 are schematic cross-sectional views illustrating an embodiment of a process of providing an adhesive member ADF.

Referring to FIGS. 13 and 14, the process of providing an adhesive member ADF includes placing a material layer of the non-coloring portion NCL on the first adhesive layer ACF, placing a shadow mask MK on the material layer at a non-coloring area NCA of the adhesive member ADF, applying a color former to form a second adhesive layer DVP including the non-coloring portion NCL and the coloring portion CL, placing a third adhesive layer NCF on the second adhesive layer DVP, and irradiating a coloring area CA of the adhesive member ADF with a laser beam L using a laser module LD to expose the coloring portion CL to outside the third adhesive layer NCF.

A material layer of a non-coloring portion NCL may be placed on a first adhesive layer ACF. The material layer of the non-coloring portion NCL may include, for example, a salicylic acid metal salt as a color developing agent.

A shadow mask MK may be placed on the material layer of the non-coloring portion NCL. The shadow mask MK may be a mask including an opening which exposes a predetermined area to outside the shadow mask MK. The shadow mask MK may include or be made of a metal, but the material thereof is not limited thereto. In an embodiment, the shadow mask MK may expose the material layer of the non-coloring portion NCL at a coloring area CA, and may cover the material layer of the non-coloring portion NCL at a non-coloring area NCA. Therefore, a color former material CLD to be sprayed in a subsequent process may be applied only to the material layer of the non-coloring portion NCL at the coloring area CA.

The color former material CLD may be sprayed in a direction from the shadow mask MK toward the material layer of the non-coloring portion NCL. The color former material CLD may be sprayed, but the invention is not limited thereto. The color former material CLD may be applied to the material layer of the non-coloring portion NCL in a liquid state. As described above, due to the shadow mask MK, the color former material CLD may be applied only to the material layer of the non-coloring portion NCL at the coloring area CA. The color former material CLD may be combined with the material layer of the non-coloring portion NCL to form the coloring portion CL of the second adhesive layer DVP. That is, the coloring portion CL may include a combination of the material in the non-coloring portion NCL and the color former material CLD. Thus, a second adhesive layer DVP including the coloring portion CL may be provided or formed at a predetermined area.

The shadow mask MK is removed from the second adhesive layer DVP. After the shadow mask MK is removed, a material layer of a third adhesive layer NCF may be provided on the second adhesive layer DVP. As described above, the third adhesive layer NCF does not include the conductive ball CB, and may have a lower modulus than the first adhesive layer ACF.

The material layer of the third adhesive layer NCF at the coloring area CA may be irradiated with a laser beam L using a laser module LD to expose the coloring portion CL to outside the third adhesive layer NCF, thereby forming an adhesive member ADF. An opening in the third adhesive layer NCF extends through an entirety of the thickness thereof, to expose the coloring portion CL to outside the third adhesive layer NCF, but the invention is not limited thereto.

Hereinafter, embodiments of the adhesive member ADF and the display device 1 including the same will be described. In the following embodiments, descriptions of the same configurations as those of the previously described embodiments will be omitted or simplified, and differences will be mainly described.

Figure 15:
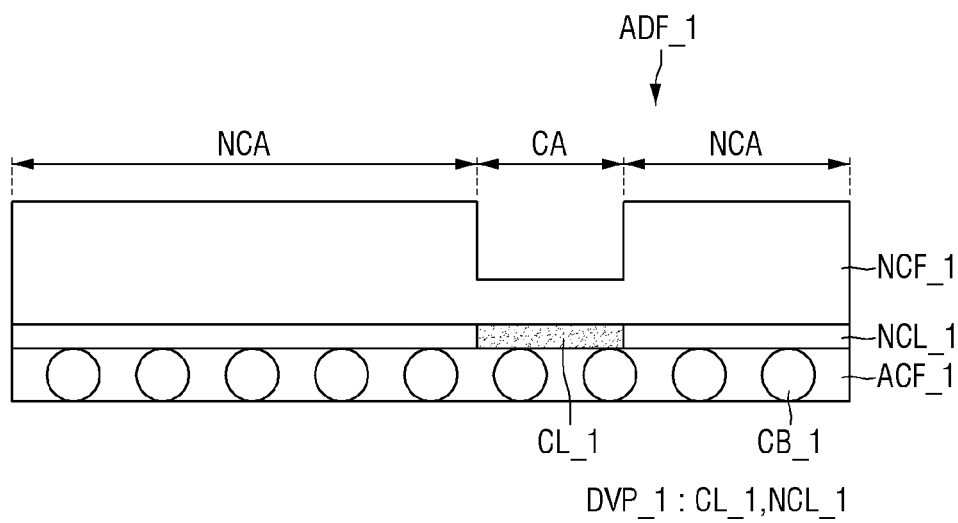
FIG. 15 is a cross-sectional view of an embodiment of an adhesive member.
Figure 16:
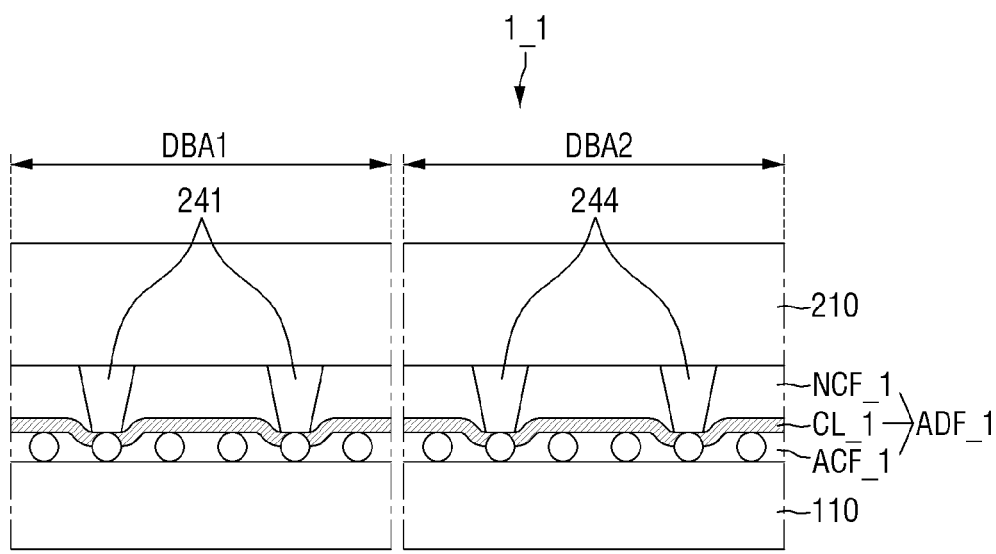
FIG. 16 is a cross-sectional view of an embodiment of a display device including the adhesive member of FIG. 15.

FIG. 15 is a cross-sectional view of an embodiment of an adhesive member ADF_1, and FIG. 16 is a cross-sectional view of a display device 1_1 including the adhesive member ADF_1 of FIG. 15.

The adhesive member ADF_1 may include a first adhesive layer ACF_1 including a conductive ball CB_1, a second adhesive layer DVP_1 disposed on the first adhesive layer ACF_1 and including a coloring portion CL_1 (e.g., color-changing portion) and a non-coloring portion NCL_1 (e.g., non-color changing portion), and a third adhesive layer NCF_1 disposed on the second adhesive layer DVP_1.

Referring to FIGS. 15 and 16, an adhesive member ADF_1 is different from the adhesive member ADF in that a coloring portion CL_1 is not exposed to outside the adhesive member ADF_1 at the coloring area CA. Within a third adhesive layer NCF_1 of the adhesive member ADF_1, a thickness of the third adhesive layer NCF_1 in the coloring area CA may be smaller than the thickness thereof in the non-coloring area NCA. The adhesive member ADF_1 may be provided or manufactured by irradiating an amount of a laser beam L during the manufacturing process which is smaller than the amount irradiated in the previous embodiment, to provide the smaller thickness at the non-coloring area NCA, but is not limited thereto.

The portion of the third adhesive layer NCF_1 at the coloring portion CL_1 provides an adhesive force of the adhesive member ADF_1 at the coloring area CA. Referring to FIG. 15, an inspection bump may penetrate through the portion of the third adhesive layer NCF_1 at the coloring portion CL_1.

The adhesive member ADF_1 may include a color former, the color of which is changeable according to heat or pressure applied thereto. Therefore, attachment flatness of objects of the display device 1_1 which are attachable to each other may be checked or verified by observing the color change of the color former included in the adhesive member ADF_1.

Figure 17:
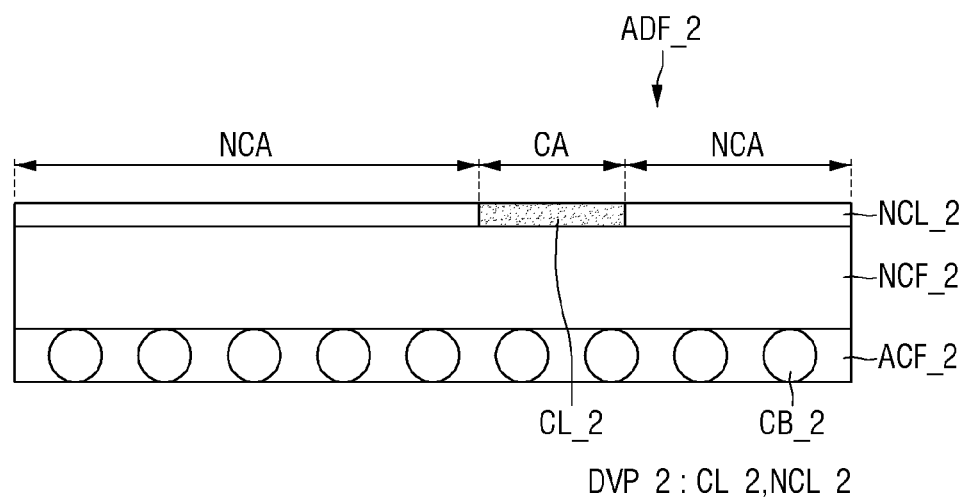
FIG. 17 is a cross-sectional view of an embodiment of an adhesive member.
Figure 18:
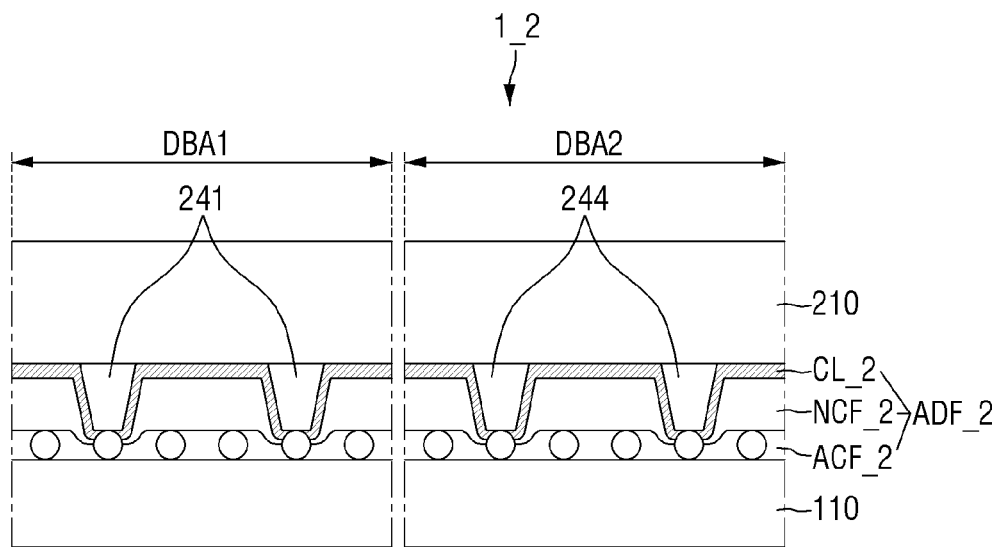
FIG. 18 is a cross-sectional view of an embodiment of a display device including the adhesive member of FIG. 17.

FIG. 17 is a cross-sectional view of an embodiment of an adhesive member ADF_2, and FIG. 18 is a cross-sectional view of an embodiment of a display device 1_2 including the adhesive member ADF_2 of FIG. 17.

The adhesive member ADF_2 may include a first adhesive layer ACF_2 including a conductive ball CB_2, a second adhesive layer DVP_2 disposed on the first adhesive layer ACF_2 and including a coloring portion CL_2 (e.g., color-changing portion) and a non-coloring portion NCL_2 (e.g., non-color changing portion), and a third adhesive layer NCF_2 disposed on the second adhesive layer DVP_2.

Referring to FIGS. 17 and 18, an adhesive member ADF_2 is different from the adhesive member ADF in that the adhesive member ADF_2 includes a first adhesive layer ACF_2, a third adhesive layer NCF_2 disposed on the first adhesive layer ACF_2, and a second adhesive layer DVP_2 disposed on the third adhesive layer NCF_2. That is, there is a difference in that the stacking order of the second adhesive layer DVP_2 and the third adhesive layer NCF_2 is changed.

A display device 1_2 is different from the display device 1 in that a coloring portion CL_2 including a color former directly contacts the driving circuit chip 200 as well as the distal ends of the first to fourth inspection bumps 241 to 244. Accordingly, the coloring portion CL_2 included in the display device 1_2 may be subjected to pressure not only by a force from the first and fourth inspection bumps 241 and 244 but also from a force supplied by the driving circuit chip 200, thereby exhibiting improved color-changing performance.

The adhesive member ADF_2 may include a color former, the color of which is changeable according to heat or pressure applied thereto. Therefore, attachment flatness of objects of the display device 1_2 which are attachable to each other may be checked or verified by observing the color change of the color former included in the adhesive member ADF_2.

Figure 19:
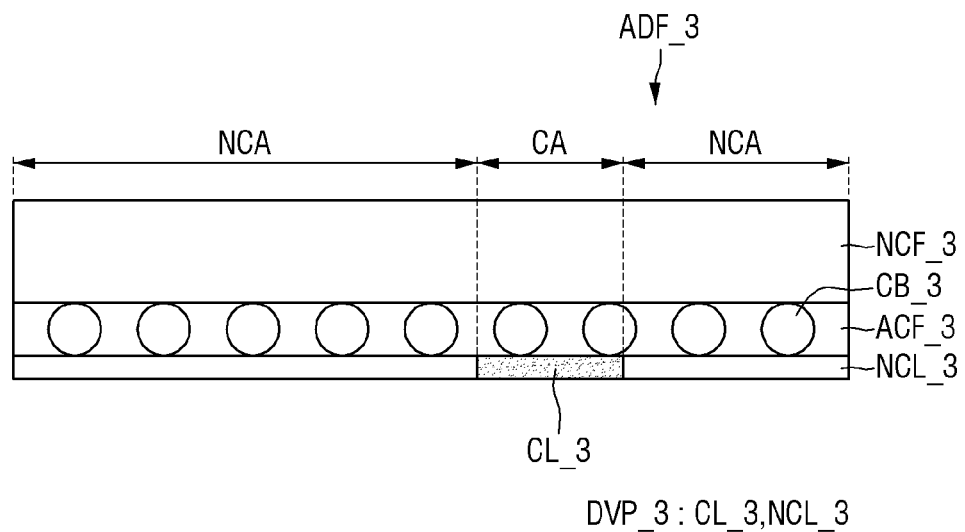
FIG. 19 is a cross-sectional view of an embodiment of an adhesive member.
Figure 20:
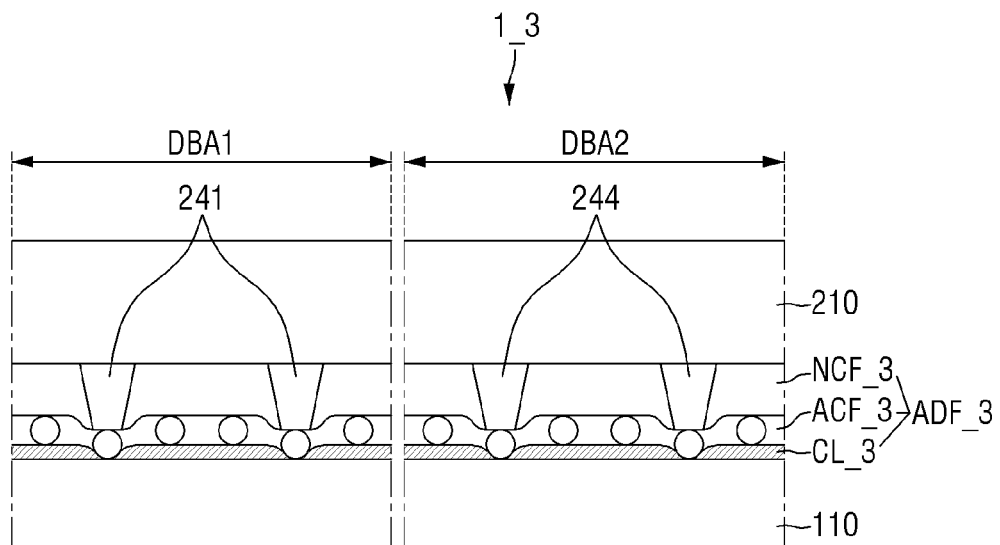
FIG. 20 is a cross-sectional view of an embodiment of a display device including the adhesive member of FIG. 19.

FIG. 19 is a cross-sectional view of an embodiment of an adhesive member ADF_3, and FIG. 20 is a cross-sectional view of an embodiment of a display device 1_3 including the adhesive member ADF_3 of FIG. 19.

The adhesive member ADF_3 may include a first adhesive layer ACF_3 including a conductive ball CB_3, a second adhesive layer DVP_3 disposed on the first adhesive layer ACF_3 and including a coloring portion CL_3 (e.g., color-changing portion) and a non-coloring portion NCL_3 (e.g., non-color changing portion), and a third adhesive layer NCF_3 disposed on the second adhesive layer DVP_3.

Referring to FIGS. 19 and 20, an adhesive member ADF_3 is different from the adhesive member ADF in that the adhesive member ADF_3 includes a second adhesive layer DVP_3, a first adhesive layer ACF_3 disposed on the second adhesive layer DVP_3, and a third adhesive layer NCF_3 disposed on the first adhesive layer ACF_3. That is, there is a difference in that the stacking order of the first adhesive layer ACF_3 and the second adhesive layer DVP_3 is changed.

In a display device 1_3, a coloring portion CL_3 including a color former directly contacts the substrate 110. Since the coloring portion CL_3 is disposed in direct contact with the substrate 110 without having the first adhesive layer ACF_3 and/or the third adhesive layer NCF_3 therebetween, a color change of the coloring portion CL_3 in the display device 1_3 may be clearly observable in determining the attachment flatness from the rear side of the substrate 110.

The adhesive member ADF_3 may include a color former, the color of which is changeable according to heat or pressure applied thereto. Therefore, attachment flatness of objects of the display device 1_3 which are attachable to each may be checked or verified by observing the color change of the color former included in the adhesive member ADF_3.

Figure 21:
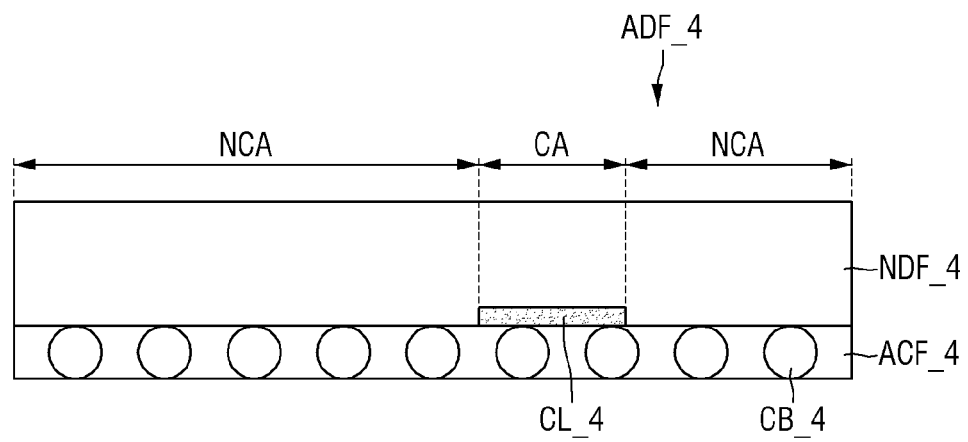
FIG. 21 is a cross-sectional view of an embodiment of an adhesive member.
Figure 22:
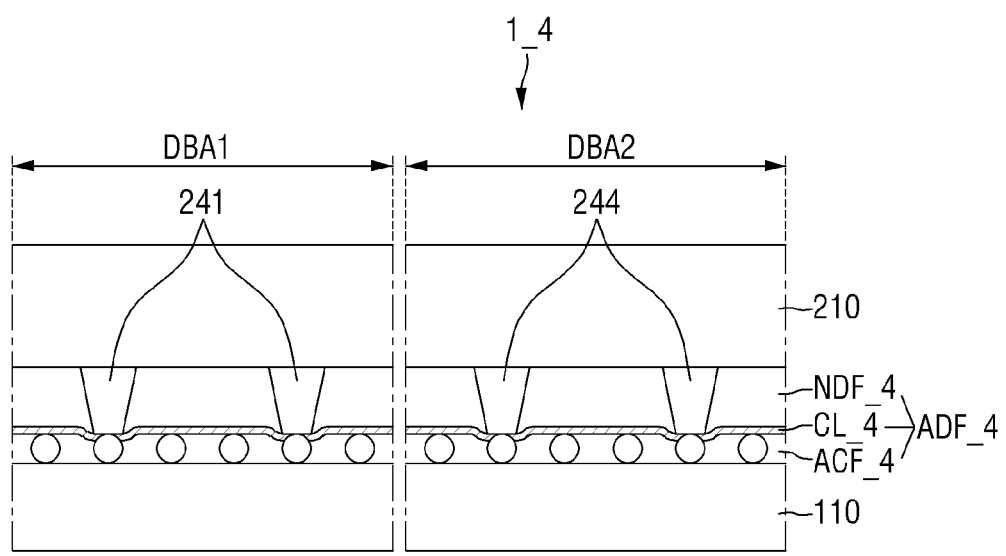
FIG. 22 is a cross-sectional view of an embodiment of a display device including the adhesive member of FIG. 21.

FIG. 21 is a cross-sectional view of an embodiment of an adhesive member ADF_4, and FIG. 22 is a cross-sectional view of an embodiment of a display device 1_4 including the adhesive member ADF_4 of FIG. 21.

Referring to FIGS. 21 and 22, an adhesive member ADF_4 is different from the adhesive member ADF in that the adhesive member ADF_4 includes a first adhesive layer ACF_4 including a conductive ball CB_4, a coloring portion CL_4 disposed on the first adhesive layer ACF_4, and a fourth adhesive layer NDF_4 disposed on the first adhesive layer ACF_4 and covering the coloring portion CL_4. The fourth adhesive layer NDF_4 may include a material layer having a combination of materials of the second adhesive layer DVP and the third adhesive layer NCF in one or more embodiment of the adhesive member ADF.

Since the display device 1_4 includes a fourth adhesive layer NDF_4 which performs both functions of the second adhesive layer DVP and the third adhesive layer NCF included in one or more of the adhesive member ADF described above, a color change of the coloring portion CL_4 in the display device 1_4 may be observable in determining attachment flatness from the rear side of the substrate 110.

The adhesive member ADF_4 may include a color former, the color of which is changeable according to heat or pressure applied thereto. Therefore, attachment flatness of objects of the display device 1_4 which are attachable to each other may be determined by observing the color change of the color former included in the adhesive member ADF_4.

Figure 23:
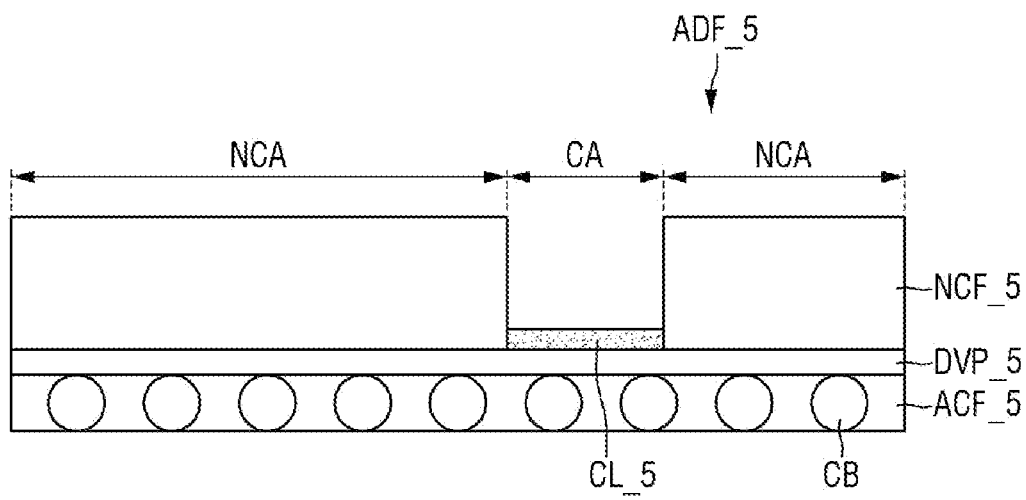
FIG. 23 is a cross-sectional view of an embodiment of an adhesive member.
Figure 24:
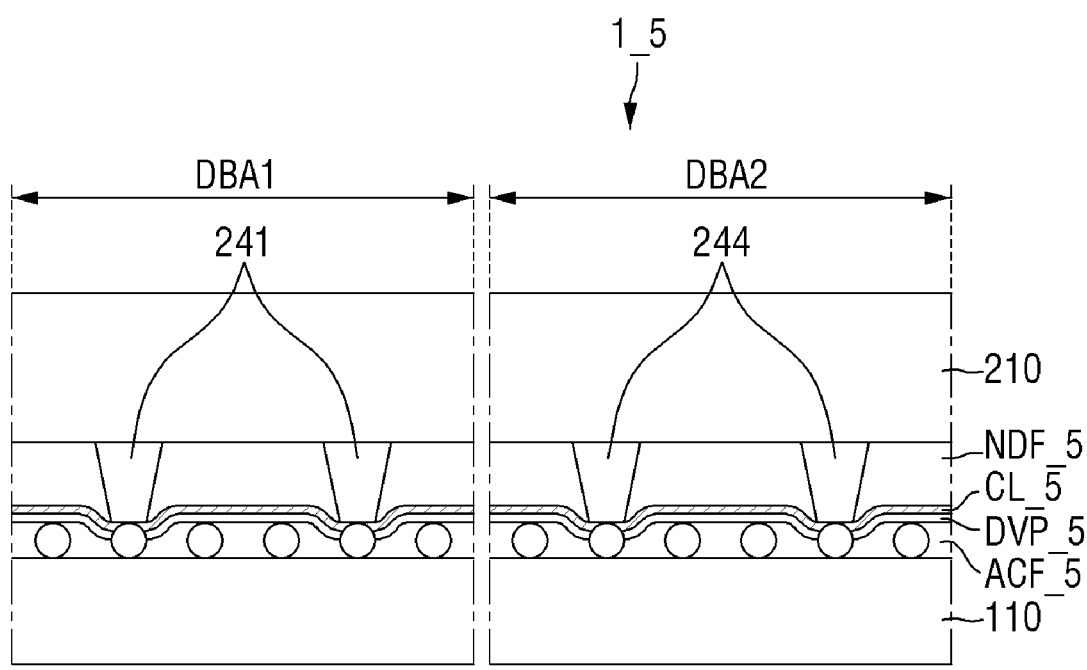
FIG. 24 is a cross-sectional view of an embodiment of a display device including the adhesive member of FIG. 23.

FIG. 23 is a cross-sectional view of an embodiment of an adhesive member ADF_5, and FIG. 24 is a cross-sectional view of an embodiment of a display device 1_5 including the adhesive member ADF_5 of FIG. 23.

Referring to FIGS. 23 and 24, an adhesive member ADF_5 is different from one or more of the adhesive member ADF described above in that the adhesive member ADF_5 includes a first adhesive layer ACF_5, a second adhesive layer DVP_5 disposed on the first adhesive layer ACF_5, a coloring pattern CL_5 (e.g., color-changing pattern) disposed on the second adhesive layer DVP_5, and a third adhesive layer NCF_5 disposed on the second adhesive layer DVP_5 and covering the coloring pattern CL_5. That is, there is a difference in that the coloring pattern CL_5 is not included in the second adhesive layer DVP_5 but is disposed separately. The material layer of the second adhesive layer DVP_5 may include, for example, a salicylic acid metal salt as a color developing agent.

Referring to FIG. 23, for example, the third adhesive layer NCF_5 may be provided or formed by applying and curing a material layer of the second adhesive layer DVP_5 on the first adhesive layer ACF_5, and then patterning a material layer of the coloring pattern CL_5 to provide the coloring pattern CL_5.

The display device 1_5 may include the adhesive member ADF_5 from which the coloring pattern CL_5 and the second adhesive layer DVP_5 are separate layers. In the display device 1_5, after curing a material of the second adhesive layer DVP_5, the coloring pattern CL_5 is patterned at a desired position along the substrate to affect a more precise position of the coloring area CA.

The adhesive member ADF_5 may include a color former, the color of which is changeable according to heat or pressure applied thereto. Therefore, attachment of flatness of objects of the display device 1_5 which are attachable to each other may be checked or verified by observing the color change of the color former included in the adhesive member ADF_5.

The effects of the invention are not limited by the foregoing, and other various effects are anticipated herein.

Although embodiments of the invention have been disclosed for illustrative purposes, those skilled in the art will appreciate that various modifications, additions and substitutions are possible, without departing from the scope and spirit of the invention as disclosed in the accompanying claims.

In concluding the detailed description, those skilled in the art will appreciate that many variations and modifications can be made to the embodiments without substantially departing from the principles of the invention. Therefore, the embodiments of the invention are used in a generic and descriptive sense only and not for purposes of limitation.

What is claimed is:

1. A display device, comprising:
a substrate including a conductive pad;
a driving chip facing the substrate and including:
a conductive bump electrically connected to the conductive pad, and
an inspection bump which is insulated from the conductive pad; and
an adhesive member which is between the conductive pad and the driving chip and connects the conductive pad to the driving chip,
wherein the adhesive member includes:
a first adhesive layer including a conductive ball; and
a second adhesive layer facing the first adhesive layer, the second adhesive layer including:
a first area including a color-changing material, and
a second area adjacent to the first area and excluding the color-changing material.

2. The display device of claim 1, wherein the inspection bump corresponds to the first area of the second adhesive layer.

3. The display device of claim 2, wherein the inspection bump of the driving chip is spaced apart from the conductive pad, along the substrate.

4. The display device of claim 1, wherein within the driving chip, the inspection bump is provided in plural including inspection bumps respectively at opposing sides of the conductive bump, along a first direction.

5. The display device of claim 1, wherein within the adhesive member, the first adhesive layer including the conductive ball further includes a first adhesive material having a first modulus.

6. The display device of claim 5, wherein
the adhesive member further includes a third adhesive layer facing the substrate with the first adhesive layer therebetween, and
the third adhesive layer includes a second adhesive material having a second modulus which is smaller than the first modulus of the first adhesive layer.

7. The display device of claim 5, wherein within the adhesive member, the second adhesive layer includes a second adhesive material having a second modulus which is smaller than the first modulus of the first adhesive layer.

8. The display device of claim 5, wherein
the adhesive member further includes a third adhesive layer facing the substrate with the first adhesive layer and the second adhesive layer therebetween, and
the third adhesive layer includes a second adhesive material having a second modulus which is smaller than the first modulus of the first adhesive layer.

9. The display device of claim 1, wherein the color-changing material changes color by pressure applied to the first area of the second adhesive layer.

10. The display device of claim 1, wherein the inspection bump has a closed curve shape including an opening therein.

11. A display device, comprising:
a substrate including a conductive pad;
a driving chip facing the substrate and including:
a conductive bump electrically connected to the conductive pad, and
an inspection bump which is insulated from the conductive pad; and
an adhesive member which is between the conductive pad and the driving chip and connects the conductive pad to the driving chip,
wherein the adhesive member includes:
a color-changing pattern including a color-changing material;
a first adhesive layer including:
a first area corresponding to the color-changing pattern, and
a second area adjacent to the first area and corresponding to the conductive pad of the driving chip; and
a second adhesive layer facing the first adhesive layer and corresponding to both the first area and the second area of the first adhesive layer.

12. The display device of claim 11, wherein the inspection bump corresponds to the first area of the first adhesive layer.

13. The display device of claim 11, wherein the color-changing material changes color by pressure applied to the color-changing pattern.

14. The display device of claim 11, wherein within the adhesive member:
the first adhesive layer includes a first adhesive material having a first modulus, and
the second adhesive layer includes a second adhesive material having a second modulus which is smaller than the first modulus of the first adhesive layer.

15. The display device of claim 11, wherein the inspection bump has a closed curve shape including an opening therein.

16. An adhesive member, comprising:
a first adhesive layer which electrically connects a driving chip of a display device to a conductive pad of a substrate of the display device; and
a second adhesive layer facing the first adhesive layer, the second adhesive layer including:
a first area corresponding to an inspection bump of the driving chip which is insulated from the conductive pad of the substrate, the first area including a color-changing material, and
a second area corresponding to the conductive pad of the substrate, the second area excluding the color-changing material.

17. The adhesive member of claim 16, wherein the first adhesive layer includes a conductive ball.

18. The adhesive member of claim 17, wherein the first adhesive layer includes a first adhesive material having a first modulus.

19. The adhesive member of claim 18, further comprising a third adhesive layer facing the substrate with the first adhesive layer and the second adhesive layer therebetween, wherein the third adhesive layer includes a second adhesive material having a second modulus which is smaller than the first modulus of the first adhesive layer.

20. The adhesive member of claim 18, wherein the second adhesive layer includes a second adhesive material having a second modulus which is smaller than the first modulus of the first adhesive layer.

21. The adhesive member of claim 18, further comprising a third adhesive layer between the first adhesive layer and the second adhesive layer and including a second adhesive material having a second modulus which is smaller than the first modulus of the first adhesive layer.

22. The adhesive member of claim 16, wherein the color-changing material changes color by pressure applied to the first area of the second adhesive layer.

\* \* \* \* \*